United States Patent

Tomono et al.

[11] Patent Number: 6,117,240
[45] Date of Patent: Sep. 12, 2000

[54] LIQUID APPLYING APPARATUS AND AN IMAGE FORMING SUBSTANCE REMOVING APPARATUS

[75] Inventors: Hidenori Tomono, Yokohama; Eriko Chiba, Kawasaki; Hiromichi Komai; Toshio Kawakubo, both of Yokohama; Tohru Maruyama, Fujisawa; Masatoshi Saitou, Machida, all of Japan

[73] Assignee: Ricoh Company, Ltd., Tokyo, Japan

[21] Appl. No.: 09/393,656

[22] Filed: Sep. 10, 1999

Related U.S. Application Data

[62] Division of application No. 09/003,640, Jan. 7, 1998, which is a division of application No. 08/589,562, Jan. 22, 1996, Pat. No. 5,759,278.

[30] Foreign Application Priority Data

| Jan. 20, 1995 | [JP] | Japan | P07-026087 |
| Jun. 30, 1995 | [JP] | Japan | P07-188476 |
| Oct. 24, 1995 | [JP] | Japan | P07-300718 |

[51] Int. Cl.$^7$ ................................................ B05C 1/08
[52] U.S. Cl. ........................ 118/668; 118/676; 118/62; 118/236; 118/244; 118/256
[58] Field of Search ...................... 118/62, 63, 236, 118/244, 256, 257, 671, 673, 676, 668; 242/541.7, 908; 162/207, 136; 427/348; 101/424.1, 475

[56] References Cited

U.S. PATENT DOCUMENTS

| 2,442,876 | 6/1948 | Pearson | 118/257 |
| 2,491,019 | 12/1949 | Werker | 118/248 |
| 2,614,522 | 10/1952 | Snyder | 118/681 |
| 3,367,791 | 2/1968 | Lein | 430/119 |
| 3,688,735 | 9/1972 | Brenner | 118/681 |
| 3,779,206 | 12/1973 | Sato et al. | 118/63 |
| 3,929,097 | 12/1975 | Kanda et al. | 118/62 |
| 4,241,111 | 12/1980 | Hamamura et al. | 427/348 |
| 4,558,725 | 12/1985 | Veneziale | 144/362 |
| 4,737,378 | 4/1988 | Narita et al. | 427/8 |
| 4,764,236 | 8/1988 | Nikkel | 156/210 |
| 5,129,980 | 7/1992 | Sissons | 156/470 |
| 5,476,546 | 12/1995 | Zibulla | 118/668 |
| 5,547,793 | 8/1996 | Kuramoto et al. | 430/97 |
| 5,607,534 | 3/1997 | Kawanishi et al. | 16/234 |
| 5,759,278 | 6/1998 | Tomono et al. | 118/681 |
| 5,858,093 | 1/1999 | Saitoh et al. | 118/212 |

*Primary Examiner*—Laura Edwards
*Attorney, Agent, or Firm*—Oblon, Spivak, McClelland, Maier & Neustadt, P.C.

[57] ABSTRACT

An image forming substance removing apparatus for preventing an unstabilizing liquid from being excessively applied to a sheet material unnecessarily, preventing a bad state of transporting the sheet material, and not requiring a long time for drying the sheet material is provided. In the above-mentioned apparatus, an unstabilizing liquid supplying unit applies the unstabilizing liquid to the transfer material and is constructed with an applying roller for pumping up the unstabilizing liquid by an action of its rotation, a restriction roller for bringing the applying roller into contact with the transfer paper, and others. And further, in order to move the restriction roller between a position of coming into contact with the applying roller and a position of departing therefrom, a tip end sensor for sensing the tip end of the transfer paper, a spring, and a solenoid, etc. are provided in the apparatus.

5 Claims, 15 Drawing Sheets

FLOW OF RECYCLING COPIED PAPER

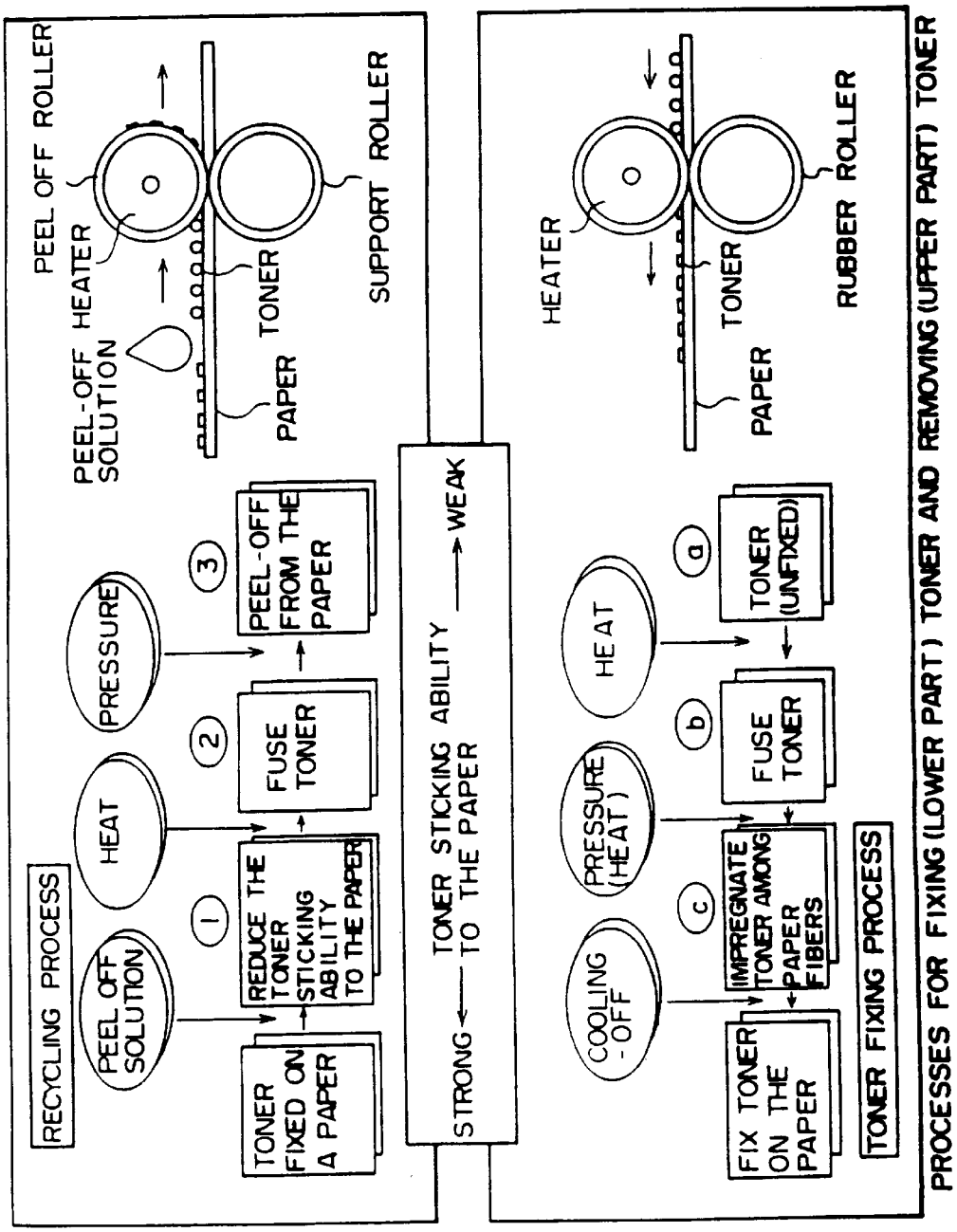

LIQUID APPLYING APPARATUS AND AN IMAGE FORMING SUBSTANCE REMOVING APPARATUS

This application is a Division of application Ser. No. 09/003,640 Filed Jan. 7, 1998, which is a division of Ser. No. 08/589,562 filed Jan. 22, 1996, now U.S. Pat. No. 5,759,278.

BACKGROUND OF THE INVENTION

1. Field of the Invention

The present invention relates to a liquid applying apparatus for uniformly applying liquid onto a sheet-state object, in particular, a liquid applying apparatus for applying liquid onto an object by bringing the object to be applied with the liquid into contact with a liquid applying member.

And further, the present invention relates to an image forming substance removing apparatus for removing an image forming substance from a sheet-state image carrier to which the image forming substance is stably attached by an image forming apparatus such as a facsimile device, printer, etc., in particular, an image forming substance removing apparatus for applying an unstabilizing liquid onto the image carrier by use of the aforementioned liquid applying apparatus and thereafter removing the image forming substance from the image carrier applied with the unstabilizing liquid by use of the image forming substance removing apparatus.

2. Description of the Background Art

Conventionally, there are various sorts of image forming substance removing apparatus for removing in image forming substance from a sheet-state image carrier stably applied with the image forming substance such as toner on the surface thereof, for instance, a used (copied) sheet of paper. The published specification of Japanese Laid-open Patent Publication No. 1-101576/1989, as an example of the image forming substance removing apparatus, discloses an image forming substance removing apparatus for dipping the image carrier applied with toner as the image forming substance into solvent, applying an ultrasonic vibration thereto, and peeling off the toner melted in the solvent from the surface of the paper.

And further, the published specification of Japanese Laid-open Patent Publication No. 4-300395/1992 discloses another image forming substance removing apparatus for applying the solvent on the printed portion of the image carrier by use of the method of dipping, spraying, or painting, melting the toner as an image forming substance therein, removing the melted toner by use of a method of cleaning, air-sucking, contacting with sucking solvent (agent), mechanical peeling-off, or electrostatic sucking, etc., and thereafter, performing a process of finishing paper employed as the image carrier by drying and/or expanding the paper, etc.

However, in such image forming substance removing apparatus employing the solvent as mentioned above, since the employed solvent exerts a bad influence on the human body or the environment, it is unfavorable to install the above-mentioned apparatus in an office. And further, it is necessary to employ various sorts of solvent in different ways in accordance with the sorts of the image forming substance and thereby the working becomes complicated (troublesome). These are problems to be solved in the conventional arts.

On the other hand, as an example of an apparatus not employing such a solvent, the published specification of Japanese Laid-open Patent Publication No. 2-255195/1990 discloses still another image forming substance removing apparatus in which thermo-fusable ink or toner is applied to a printing body employed as the image carrier, and which has a peeling-off agent painted on (applied to) the supporting body thereof by use of the electrophotographic method or the thermal transferring method, the above-mentioned printing body is superposed on an ink peeling-off body and the united bodies pass through the space between the heating roller and the pressurizing roller, the ink peeling-off body is removed (peeled off) from the printing body after cooling these united bodies, and thereby the ink or toner is attached to the ink peeling-off body for removing the ink or toner from the printing body (image carrier).

Furthermore, the published specification of Japanese Laid-open Patent Publication No. 4-64472/1992 discloses still another image forming substance removing apparatus including an endless sheet having at least a thermo-fusable resin on the surface thereof, a heating roller and a cooling roller for supporting and rotating the endless sheet thereon, a pressurizing roller for pressurizedly pushing the paper (erasable paper) employed as an image carrier having a surface processed with the peeling-off treatment on the surface thereof onto the softened or fused thermo-fusable resin, and a driving portion for driving unitarily these elements.

And further, the published specification of Japanese Laid-open Patent Publication No. 4-82983/1992 discloses still another image forming substance removing apparatus including a pair of rollers disposed in parallel rotating in a state of being brought into pressurized contact with each other and causing the paper employed as the image carrier to pass through the pressurized space between the pair of rollers, a heater for heating at least one of the pair of rollers, a scratching member for separating the paper from the rollers after passing therethrough, and a peeling-off unit for removing (peeling off) the image forming substance attached to the rollers.

However, in the image forming substance removing apparatus not employing such solvents, if the apparatus is employed for removing the image forming substance from the recorded or copied sheet material (image carrier) having an image recorded on ordinary paper, on the surface of which paper fiber is exposed, the image forming substance is firmly stuck to the fiber on the surface of the sheet material, for instance, the image forming substance having thermo-fusable resin as a main component is fusedly fixed on the sheet material on the fixing process of the electrophotographic method. Consequently, the paper fiber on the surface of the sheet material is peeled off together with the image forming substance at the time of removing the image forming substance therefrom, and thereby the paper is injured. This is a problem to be solved. And further, in order to enhance the removing property of the image forming substance, heat and pressure are applied onto the above-mentioned ink peeling-off agent, endless sheet, or roller. On this occasion, the fixing property between the image forming substance and the sheet material is also enhanced contrary to the expectation, and as a result the removal of the image forming substance becomes difficult according to the various conditions.

In such a situation, the present applicant (inventors) has already proposed previously still another image forming substance removing apparatus in which at least one sort of water or water solution selected from the group including water employed as an unstabilizing liquid, a water solution containing a surface active agent, a water solution containing a water soluble polymer, and a water solution containing both of a surface active agent and a water soluble polymer is applied (by painting) to the copied sheet material employed as the image carrier or the object to be applied (painted) with the image forming substance is applied to the copied sheet material employed as the image carrier or the object to be liquid-applied (painted), and thereby the image forming substance is removed from the sheet material applied (painted) with the unstabilizing liquid by use of the image forming substance removing means. (For instance, refer to Japanese Patent Application No. 4-255916/1992.) According to this apparatus, the solvent employed therein does not exert any bad influence on the human body or the environment and thereby the apparatus can be installed in an office. Furthermore, it is not always necessary to employ the solvent in different ways in accordance with the sort of the copied sheet material.

And further, according to this apparatus, only the image forming substance can be removed without comparatively (considerably) damaging the paper property of the sheet material.

This image forming substance removing apparatus includes a liquid applying apparatus carrying the unstabilizing liquid, the surface of which is driven so as to endlessly move the surface thereof by carrying the unstabilizing liquid, and which applies (paints) the unstabilizing liquid to the copied sheet material employed as the image carrier, and an image forming substance removing medium which brings the copied sheet material into contact with the sheet material in a state of being painted with the unstabilizing liquid and removes the image forming substance from the copied sheet material.

FIG. 25 is an explanatory diagram showing the liquid applying (painting) apparatus provided with the background image forming substance removing apparatus. As shown in FIG. 25a, this liquid painting apparatus includes a tank 101 containing unstabilizing liquid 100 wherein, an applying (painting) roller 102 employed as a liquid applying (painting) member which is disposed so as to partially dip the roller 102 in the tank 101, and a contacting roller 104 employed as a contacting member disposed at a position opposing the applying roller 102. In this apparatus, the applying roller 102 rotates in a direction as shown by an arrow A, and the circumferential surface thereof carries the unstabilizing liquid 100 and moves endlessly. And then, the contacting roller 104 is brought into contact with the sheet material 105 transported in a direction as shown by an arrow B, and thereby the unstabilizing liquid loo is applied (painted) on the sheet material 105.

SUMMARY OF THE INVENTION

One object of the present invention is to overcome drawbacks in the background devices.

In such a situation of the device of FIG. 25, according to such a construction as mentioned heretofore, a residual liquid mass 106 including an of unstabilizing liquid is created as shown in FIG. 25b on the position (nipping portion) where the painting roller 102 and the contacting roller 104 are disposed at a position adjoining each other after completing the operation of applying the unstabilizing liquid 100 to a certain sheet material 105.

For this reason, the unstabilizing liquid 100 creating the residual liquid mass 106 is attached to the sheet material 105 to be applied (painted) thereafter with the stabilizing liquid 100. And further, as shown in FIG. 25c, an area 105a being unnecessarily attached thereto with a large amount of the unstabilizing liquid 100 is created at the place near the tip end portion and the side circumferential portion of the sheet material 105. Consequently, an uniform liquid applying (painting) cannot be done. It is difficult to safely (stably) convey the sheet material 105 excessively attached thereto with the stabilizing liquid 100. Furthermore, the operations of removing the image forming substance from the sheet material 105 and thereafter drying the sheet material 105 require a long time. These are the problems to be solved.

As one feature, the present invention is made for solving the abovementioned subject matters.

Accordingly, one object of the present invention is to prevent nonuniform applying of an unstabilizing liquid to a sheet material employed as an image carrier, unfavorable transportation of the sheet material due to a phenomenon of creating an area excessively applied with the unstabilizing liquid, and requiring a long time for drying the sheet material.

In order to attain the above objects, the present invention provides a liquid applying apparatus capable of uniformly applying the processing liquid such as the unstabilizing liquid, etc. to the sheet material or the like.

And further, the present invention provides an image forming substance removing apparatus for preventing the occurrence of the unfavorable transportation of the sheet material and the operation of drying the sheet material requiring a long time, which is provided with the abovementioned related liquid applying apparatus.

In practice, the liquid applying apparatus according to the present invention can be widely utilized for performing the operation of uniformly applying the liquid onto the object to be applied with the liquid without being limited to the above-mentioned objects. The utilization of the apparatus is not limited to the above-mentioned objects.

Namely, in order to attain the above-mentioned objects, the following action is done. After the processing of applying the liquid is finished, the applied liquid remains as a residual liquid mass between the liquid applying member and the contact member, and next, when the processing of applying the liquid is performed again, the liquid to be applied which is put in a state of remaining as the residual liquid mass is applied to the tip end portion of the image carrier or the sheet material as the object to be applied with the liquid, and thereby the liquid is excessively applied to the above tip end portion.

In order to eliminate the above-mentioned defects, as additionally mentioned later, it is preferable to employ a liquid applying apparatus provided with a contact member including a plurality of pressurizing portions for bringing the sheet material into pressurized contact with the liquid applying member and a flowing path for the applied liquid which is formed in the space between the above pressurizing portions disposed adjacently to each other and parallel with the direction of endlessly moving on the surface of the liquid applying member. If such a related liquid applying apparatus is employed, the applied liquid is removed from the space between the liquid applying member and the contact member through the flowing path for the applied liquid, and thereby any applied liquid does not remain in the space between the liquid applying member and the contact member. Consequently, the liquid to be applied can be prevented from being excessively applied to the tip end portion of the sheet material.

However, although, if such a liquid applying apparatus is employed it can be surely prevented that the liquid to be applied is excessively applied to the tip end portion of the sheet material, it has been made apparent that a new problem to be solved also occurred as a result of the inventors' experiment. Namely, in the case of employing the sheet material such as paper, etc., being expanded due to applying of the liquid, the portion of the sheet material which is pressed at the pressurizing portion does not expand while the other portion of the sheet material opposing the flowing path of the liquid to be applied expands due to expansion of the paper fiber.

Consequently, the portion of the sheet material brought into contact with the flowing path for the liquid to be applied is put in a floating state. Since the floating portion turns out not to be brought into contact with the liquid applying member, the processing liquid is not preferably applied thereto, and thereby the liquid cannot be uniformly applied to the sheet material.

And further, in the image forming substance removing apparatus for applying the unstabilizing liquid to the sheet material as the image carrier and removing the image forming substance from the sheet material applied with the unstabilizing liquid by use of the image forming substance removing means, in a case of employing the related liquid applying apparatus for applying the unstabilizing liquid to the sheet material, the unstabilizing liquid turns out to be nonuniformly applied to the sheet material and thereby the image forming substance cannot be removed preferably on some occasions. These are the defects to be solved.

The present invention was made in consideration of such related subject matter to be solved. The present invention provides a liquid applying apparatus capable of preventing the occurrence of the phenomenon that the portion of the object to be applied with the liquid which is not brought into contact with the liquid applying member occurs due to the expansion on the liquid-applied object and thereby the liquid turns out to be uniformly applied to the liquid-applied object, and capable of uniformly applying the liquid thereto.

The present invention further provides an image forming substance removing apparatus in which the occurrence of the unfavorable operation of removing the image forming substance due to the phenomenon of not uniformly applying the unstabilizing liquid onto the image carrier having the image forming substance stably attached thereto is prevented and thereby the image forming substance can be removed preferably.

The present invention has been made in consideration of the above-mentioned actual circumstances and troublesome matters to be solved.

It is an object of the present invention to solve the points at issue as mentioned heretofore.

It is another object of the present invention to provide a novel method and a novel apparatus for removing image forming substance from an image supporting body.

It is still another object of the present invention to prevent nonuniform applying of the unstabilizing liquid to the sheet material employed as the image carrier, unfavorable transportation of the sheet material due to the phenomenon of creating an area excessively applied with the unstabilizing liquid, and requiring a long time for drying the sheet material.

It is still another object of the present invention to provide a novel liquid applying apparatus capable of uniformly applying the processing liquid such as the unstabilizing liquid.

It is still another object of the present invention to provide a novel image forming substance removing apparatus for preventing the occurrence of the unfavorable transportation of the sheet material and the operation of drying the sheet material requiring a long time which is provided with the liquid applying apparatus.

It is still another object of the present invention to provide a novel liquid applying apparatus and a novel image forming substance removing apparatus employing the above liquid applying apparatus, for improving the subject matters mentioned heretofore.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 9b is a cross-sectional view taken along the line A—A in FIG. 9a;

FIG. 9c is a cross-sectional view taken along the line B—B in FIG. 9a;

FIG. 11b is a cross-sectional view taken along the line A—A in FIG. 11a;

FIG. 15b is a cross-sectional view taken along the line A—A in FIG. 15a;

FIGS. 15c and 15d are explanatory diagrams showing the operation of the liquid supplying unit shown in FIG. 15a;

FIG. 16a is a front view showing a modification of the liquid supplying unit shown in FIG. 15a;

FIG. 16b is an explanatory diagram showing the operation of the liquid supplying unit shown in FIG. 16a;

FIG. 18b is an enlarged explanatory diagram of the A portion of FIG. 18a;

FIG. 27 is another explanatory diagram illustrating a flow of the recycling process in a recycling machine and that of the toner fixing process in the copying machine.

DESCRIPTION OF THE PREFERRED EMBODIMENTS

A copier more friendly to a society for recycling copied paper (Copied Paper Recycling Machine) is explained hereinafter referring to FIG. 26 and FIG. 27.

Figure 26:
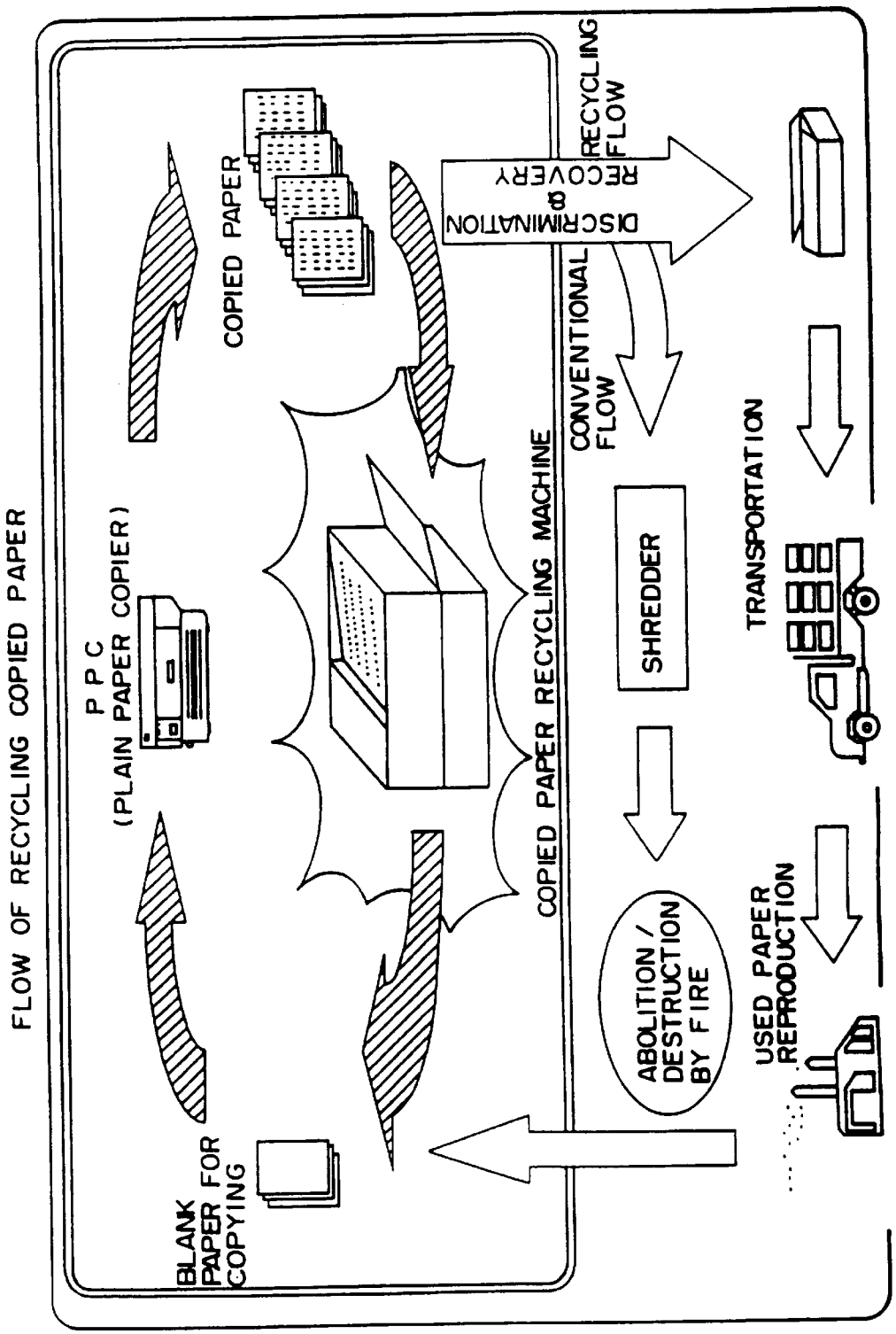
FIG. 26 is an explanatory diagram illustrating a recycling flow for copied paper.

FIG. 26 shows a flow of recycling copied paper. FIG. 27 shows a flow of the recycling process according to the present invention in comparison with that of the toner fixing process.

At any office you may go, you see a pile of paper at first in every quarter of the office. The idea of an electronized paperless office has already passed away a long time ago. In practice, the amount of paper consumption has sharply increased together with the advancement of electronics. Even in the case of obtaining electronized information, there is a necessity for hard copies employing paper. Consequently, when the recycling of the papers is discussed in the office, there arises a big Eroblem of paper consumption. At present, the amount of papers employed in offices in Japan is thought to be 1,500,000 tons per year. One third of the total amount (that is, 500,000 tons of paper) is copied paper which is copied by utilizing the electrophotographic system or technology. The rate of utilizing such a system or technology has been largely increased in accordance with an increase in number of the electrophotographic type facsimile devices and printers. For instance, in Tokyo, Marunouchi District, more than half of the office waste is "paper".

FIG. 26 shows a recycling loop of paper in the office. Conventionally, the discrimination and abolishment of paper has been processed. The paper is discriminated into corrugated cardboard, newspapers, magazines, PPC (plain paper copying) paper, etc. The degree of recycling the paper has been processed in this order. However, it is difficult to peel off the toner from the paper because of strong adhesive force between the toner and the paper. The discrimination is done not for the PPC copying paper itself, but for facilitating the recycling operation for the other type of paper.

In a present situation in which the cost of pulp is lowered as in the case of recent years, the PPC copying paper is solely abolished or burnt out, practically.

Another fatal factor which makes the recycling of paper in the office difficult is the protection of confidential matters. For this purpose, a shredder is used very often. The bulky waste remains at the time of abolishing (shredding) the paper and thereby the objects circulation is made difficult. In addition, since the paper fiber is cut (teared) into pieces, it is impossible to recycle good-quality paper.

The present technology developed in the present invention enables to peel off and remove only the toner from the PPC copying paper. Consequently, the blank paper with the toner removed therefrom can be employed for a next copying as it is. The employment cycle can be realized up to about ten times in the laboratory. Even assuming that the cycle is only one time, the amount of using the virgin (raw) pulp is largely reduced, for instance, one half, and further this matter is effective (advantageous) for the environmental security in the forest, etc.

In FIG. 26, the area encircled with a stout rectangular frame represents the flow of recycling copied paper by use of the newly developed copied paper recycling machine of the present invention. The area outside of the stout rectangular frame represents the conventional flow of recycling copied paper in two ways; which are, (1) waste copied paper is shredded by the shredder, and thereafter the paper is abolished or destroyed by fire, and (2) waste copied paper is recovered and discriminated, transported by truck to the reproducing factory, and reproduced into blank copying paper.

FIG. 27 shows a flow of the recycling process according to the present invention, in more detail, in comparison with that of the toner fixing process. The former is the inverse process to that of the latter.

Proliferation of plain paper copiers, printers and facsimiles is a symbol of advanced office automation. A huge consumption of paper in these equipments, however, has caused a keen social concern. It has been necessary to respond to this social issue by developing technologies for recycling copied paper.

Ubiquitous use of plain paper copiers (PPC) has been a symbol of office automation. The PPC technology has been adapted to laser beam printers and plain paper facsimiles to generate readable office documents. The advent of full color copiers has made possible faithful reproduction even of color images. These are good news items. There is bad news, however. Proliferation of PPC equipment generates a huge amount of paper, most of which has to be discarded after use. As noted above, the annual paper consumption in Japanese offices alone has reached 1.5 million metric tons, about one third of which involves PPC paper. Hence, recycling of copied paper has become a keen social issue in urban waste management and environmental preservation of forests.

Most PPC equipment uses toner, namely, a black powder containing thermosensitive resin, to form images on paper. The toner is first deposited by electrostatic force onto the surface of a blank paper sheet and is then firmly fixed onto the sheet by the application of heat and pressure. This melts the toner, which impregnates into spaces between paper fibers and then solidifies. The adhesion between toner and fibers is so strong that the conventional deinking process in a paper recycle plant cannot completely remove toner from fibers. This makes recycling copied paper rather difficult. Another difficulty in recycling copied paper is due to the abundant use of a shredder for security of information in office documents. A shredder cuts paper fibers into very short pieces which can be reused only in making poor quality paper.

As a leading manufacturer of PPC equipment, research on recycling copied paper has been active. The first part of this information described here presents a new technology for removing toner from a paper sheet, which can be used as a blank sheet for new copying.

The lower part of FIG. 27 shows the process for fixing toner on the surface of a paper, as described above. The new technology works almost in the opposite way to this fixing process as shown in the upper part of FIG. 27.

First, a small amount of peel-off solution is applied to the surface of a copied paper (1). The solution reduces the adhesion strength between toner and paper fibers. Next, heat is applied to fuse the toner (2), and then pressure is applied to transfer molten toner onto the surface of a peel-off roller (3). Toner thus transferred onto the peel-off roller can be scraped off and discarded. The quantity of discarded toner is small and can be handled in the conventional waste toner disposal system of PPC equipment. The peel-off solution is water-based, safe and pollution-free. Hence, there is little stress on the environment due to this recycling process. The paper thus recycled can be used again for new copying. These fixing and recycling processes can be repeated many times. A paper has been reused as many as ten times in a laboratory. In practice, however, accumulated wear and contamination will set a limit. However, one recycle operation will reduce the consumption of paper and hence forest resources to one half. Office waste also will be halved. The use of a shredder can be limited to only very sensitive documents. There are little differences in characteristics of the toner and the fixing process described in FIG. 27 among manufacturers. Hence, the same recycling process can be applied to most papers copied by machines of different makes.

Next, a prototype machine is described. Copied paper sheets in the lower tray comes out as blank sheets in the upper tray. The size of the machine is 82×63×40 cm. The operating speed is 3 sheets per minute. There is much room for improvement in performance. In fact, the second generation prototype, demonstrated in Business Show in Tokyo recently, runs at a speed of 5 sheets per minute.

A conventional recycle loop for paper is extended to the outside of an office. It includes the collection and transportation of waste and the treatment at a recycle plant. Most of its cost is borne by a local government. There are also such hidden costs to the society as traffic jams and air pollution due to truck exhaust emission. The present technology can shorten the recycle loop to one within an office and eliminate these social costs.

It should be noted, however, that the cooperation of users is essential for practical acceptance of the technology. For example, copied paper sheets have to be placed on one-sided and neatly stacked. Staples have to be removed. Paper sheets with marks by pencil or pen have to be rejected at the disposal. There are technologies available for detecting double-sided sheets or mark up or presence of a staple. However, the use of these technologies will make a machine very expensive.

In order to attain at least one of the aforementioned objects, the liquid applying apparatus in a first status of the embodiment includes:

a liquid applying member for carrying liquid and applying the liquid on a sheet-state object to be liquid-applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, moving means for moving at least one of the liquid applying member and the contact member within a space between an operating position of interposing the object to be liquid-applied with the liquid applying member and the contact member and a detaching position on which the distance between the liquid applying member and the contact member is made larger than on the operating position, and movement controlling means for positioning the liquid applying member and the contact member on the operating member during the time period when the liquid applying member applies liquid to the object to be liquid-applied, and for controlling the drive of the moving means so as to position the liquid applying member and the contact member on the detaching position during at least a predetermined time period after the liquid applying member finishes liquid applying to the object to be liquid-applied and before the liquid applying member begins liquid applying to a next object to be liquid-applied.

In the above-mentioned liquid applying apparatus, the liquid applying member and the contact member are disposed so as to be departed from each other by use of the moving means during the predetermined time period after completing the applying of the liquid to the object to be liquid-applied and before starting the applying of the liquid to the next object to be liquid-applied. For this reason, there occurs no residual liquid mass of the applying liquid on the position where the liquid applying member and the contact member are put adjacently to each other, wherein the residual liquid mass occurs when the liquid applying member and the contact member are kept to be put on the operational position where both members interpose the object to be liquid-applied therebetween. Consequently, the excessive residual liquid mass does not exist on the position where the liquid applying member and the contact member are put adjacently to each other when both members are put on the operational position of interposing the object to be liquid-applied.

In a second status of the embodiment, in the liquid applying apparatus as defined in the first status of the embodiment, the movement controlling means is constructed such that both of the liquid applying member and the contact member are positioned on the operating position before a predetermined time of starting liquid applying to the object to be liquid-applied by the liquid applying member.

In the above liquid applying apparatus, the contact member and the liquid applying member are put on the operational position of interposing the object to be liquid-applied therebetween before the predetermined time point when the liquid starts to be applied to the object to be liquid-applied, and both members are brought into contact with each other. For this reason, the liquid is applied to the surface of the contact member from the liquid applying member during the time period after disposing the both members on the operating position and before starting to apply the liquid to the object to be liquid-applied. Consequently, the object to be liquid-applied is transported in a state of coming into contact with the contact member applied with the liquid, and thereby the liquid is applied to not only the surface at the side of coming into contact with the liquid applying member, but also the surface at the side of coming into contact with the contact roller.

In a third status of the embodiment, the surface of the contact member of the liquid applying apparatus as defined in the second status of the embodiment is made of a liquid-absorbing material.

In the above liquid applying apparatus, the liquid applied to the contact member by the liquid applying member is stored on the surface of the contact member made of the liquid-absorbing material during the time period when the liquid applying member comes into contact with the contact member.

For this reason, the contact member discharges the applied liquid therefrom one time. Consequently, it is eliminated that the liquid is applied only to the partial area of the object to be liquid-applied, and thereby the liquid is applied uniformly and surely to the overall surface area at the side of the object to be liquid-applied coming into contact with the contact member.

The liquid applying apparatus in a fourth status of the embodiment includes:

a liquid applying member for carrying liquid and applying the liquid on a sheet-state object to be liquid-applied, wherein a surface of the liquid applying member is driven so as to be moved endlessly, air-flow generating means opposing the surface of the liquid applying member and disposed on a position detached from the liquid applying member, for bringing the object to be liquid-applied into contact with the surface of the liquid applying member by use of the air-flow.

The above liquid applying apparatus utilizes the air flow generating means provided on the position departing from the liquid applying member in order to bring the object to be liquid-applied into contact with the liquid applying member. For this reason, it is eliminated that the excessive residual liquid mass made of the applying liquid occurs on the position where the liquid applying member and the contact member are put adjacently to each other, in the case of employing the contact member provided on the position of coming into contact with the liquid applying member.

In the liquid applying apparatus of a fifth status of the embodiment relating to the fourth status, an air-flow containing therein vapor of the applying liquid or aqueous vapor or another air-flow including fine liquid particles of the applying liquid or water dispersed in the air is employed as the air-flow.

In particular, in the above liquid applying apparatus, the liquid applying member is brought into contact with the object to be liquid-applied by use of the above-mentioned air-flows. For this reason, the liquid is applied to not only the surface of the object to be liquid-applied at the side of coming into contact with the liquid applying member, but also the surface thereof at the side of receiving the above air-flows.

The liquid applying apparatus in a sixth status of the embodiment includes:

a liquid applying member for carrying liquid and applying the liquid on a sheet-state object to be liquid-applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, wherein the contact member includes:

an applying liquid flowing path portion in parallel with an endless moving direction of the surface of the liquid applying member, and a pressurizedly contacting portion for bringing the sheet-state object to be liquid-applied into pressurized contact with the liquid applying member.

In the above liquid applying apparatus, the liquid flows out from the position where the liquid applying member and the contact member are put adjacently to each other through the liquid flow path provided in the contact member, after applying the liquid to the object to be liquid-applied.

For this reason, there occurs no excessive residual mass of the applying liquid at the position where the liquid applying member and the contact member are put adjacently to each other, which occurs in a case that the flow path is not provided in the contact member.

In the liquid applying apparatus of a seventh status of the embodiment relating to the sixth status, a plurality of contact members are arranged in a direction perpendicular to the endless moving direction of the surface of the liquid applying member, and the applying liquid flowing path portion is formed such that the positions of the applying liquid flowing path portion provided in the respective contact members in the direction in parallel with the endlessly moving direction are different from each other between adjacent contact members.

In the above liquid applying apparatus, the flow path provided on a plurality of contact members forms the flow path on the different positions of the surface of the object to be liquid-applied, and the pressurized portion of the plural contact members is brought into pressurized contact with the different positions of the surface of the object to be liquid-applied.

For this reason, the above object applied with the liquid becomes flat, and thereby the waving of the object which may possibly occur in the case of pressurizing the object can be prevented by use of only one contact member provided with the applying liquid flow path and the pressurizedly contacting portion.

In the liquid applying apparatus of an eighth status of the embodiment relating to the sixth status, the surface of the pressurizedly contacting portion is made of a liquid-absorbing material.

In the above liquid applying apparatus, the applying liquid absorbed by the liquid-absorbing material of the pressurizing portion's surface is applied to a pressing portion of the object to be liquid-applied and the liquid is uniformly applied to the surface of the object to be liquid-applied. For this reason, it is possible to prevent the waving of the object to be liquid-applied in a case that the liquid is nonuniformly applied to the object to be liquid applied.

In the liquid applying apparatus of a ninth status of the embodiment relating to the sixth status, a spur roller is employed as the contacting member. In particular, in the above liquid applying apparatus, since the spur roller capable of being easily processed mechanically is employed, it is possible to suppress the cost-up of manufacturing the contact member.

In the liquid applying apparatus of a tenth status of the embodiment relating to the sixth status, a comb-like member is employed as the contact member. In particular, in the above liquid applying apparatus, since the comb-like member capable of being easily processed mechanically is employed, it is possible to suppress the cost-up of manufacturing the contact member.

The liquid applying apparatus in an eleventh status of the embodiment includes:

a liquid applying member for carrying liquid and applying the liquid on a sheet-state object to be liquid-applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, wherein the contact member includes:

a plurality of pressurizedly contacting portions for bringing the object to be liquid-applied into pressurized contact with the liquid applying member, and an applying liquid flowing path disposed in parallel with an endless moving direction of the surface of the liquid applying member formed between the pressurizedly contacting portions which are disposed adjacently to each other, and wherein the plural pressurizedly contacting portions can be moved in a direction approaching to or receding from each other.

In the above liquid supplying apparatus, when the expansion of the object to be liquid-applied occurs at the portion coming into contact with the applying liquid flow path, the respective pressurizedly contacting portions in a state of coming into contact with the object to be liquid-applied move in a direction of departing from each pressurizedly contacting member in accordance with the expansion of the object.

Consequently, the object to be liquid-applied is not put in a state of floating up, and thereby the object and the liquid applying member always keep in a good contacting state with each other.

The liquid applying apparatus of a twelfth status of the embodiment relating to the eleventh status further includes holding means for moving the pressurizedly contacting portion onto the predetermined position when an external force is not applied to the pressurizedly contacting portion put in a state of being moved by the action of the external force, and for holding the pressurizedly contacting portion on the predetermined position.

In the above liquid applying apparatus, when the external force is not applied to the pressurizedly contacting portion in a state of being moved by the external force, the pressurizedly contacting member moves to the predetermined position and the same is kept on the position.

The liquid applying apparatus in a thirteenth status of the embodiment includes:

a liquid applying member for carrying liquid and applying the liquid on a sheet-state object to be liquid applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, wherein the contact member includes:

a plurality of pressurizedly contacting portions made of an elastic member for bringing the object to be liquid-applied into contact with the liquid applying member, an applying liquid flowing path disposed in parallel with the endless moving direction of the surface of the liquid applying member formed between the pressurizedly contacting portions put adjacently to each other, and a supporting shaft for supporting the pressurizedly contacting portions.

In the above liquid applying apparatus, even though an expansion occurs on the portion coming into contact with the applying liquid flow path of the object to be liquid-applied, the elastic body in a state of contacting the object to be liquid-applied fixed on the supporting shaft deforms elastically in accordance with the expansion of the object.

Consequently, the object to be liquid-applied is not put in a state of floating up, and thereby the object and the liquid applying member always keep in a good contacting state with each other.

The liquid applying apparatus in a fourteenth status of the embodiment includes:

a liquid applying member for carrying liquid and applying the liquid on a sheet-state object to be liquid-applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, wherein the contact member includes:

a plurality of pressurizedly contacting portions for bringing the object to be liquid-applied into contact with the liquid applying member, and an applying liquid flowing path disposed in parallel with the endlessly moving direction of the surface of the liquid applying member formed between the pressurizedly contacting portions put adjacently to each other, and wherein the liquid applying member is transformed by bringing the pressurizedly contacting portions into pressurized contact therewith, and wherein the length of the liquid applying member between the respective pressurizedly contacting portions after the occurrence of transformation thereof becomes larger than the length of the object to be liquid-applied between the respective pressurizedly contacting members which are expanded by absorbing the liquid applied thereto.

In the above liquid applying apparatus, when the pressurizedly contacting portions are pressed and thereby the liquid applying member deforms, the length of the liquid applying member between the respective pressurizedly contacting portions becomes larger than the length of the object to be liquid-applied in a state of expanding at the respective pressurizedly contacting portions.

Consequently, the object to be liquid-applied is not put in a state of floating up, and thereby the object and the liquid applying member always keep in a good contacting state with each other.

The liquid applying apparatus in a fifteenth status of the embodiment includes:

a liquid applying member for carrying liquid and applying the liquid on a sheet-state object to be liquid-applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, wherein the contact member includes:

a plurality of pressurizedly contacting portions for bringing the object to be liquid-applied into contact with the liquid applying member, and an applying liquid flowing path disposed in parallel with the endlessly moving direction of the surface of the liquid applying member formed between the pressurizedly contacting portions put adjacently to each other, and wherein the distance formed between the pressurizedly contacting portions put adjacently to each other is equal to or less than 5 mm.

In the above liquid applying apparatus, since the distance formed therebetween is sufficiently small, for instance, not larger than 5 mm, it can be further prevented that the object to be liquid-applied is put in a state of floating up, and thereby the object and the liquid applying member always keep in a good contacting state with each other.

The liquid applying apparatus in a sixteenth status of the embodiment includes:

a liquid applying member for carrying liquid and applying the liquid on a sheet-state object to be liquid-applied, wherein a surface of the liquid applying member is driven so as to be moved endlessly, a contact member for interposing the sheet-state object to be liquid-applied and being disposed at a position opposing the surface of the liquid applying member and further bringing the object to be liquid-applied into contact with the surface of the liquid applying member, wherein the contact member includes:

a plurality of pressurizedly contacting portions for bringing the object to be liquid-applied into contact with the liquid applying member, and an applying liquid flowing path disposed in parallel with the endlessly moving direction of the surface of the liquid applying member formed between the pressurizedly contacting portions put adjacently to each other, and wherein the distance formed between the plural pressurizedly contacting portions for bringing the positions near end portions of the object to be liquid-applied into pressurized contact therewith is made smaller than the distance formed between the plural pressurizedly contacting portions for bringing the position near a center portion of the object to be liquid-applied into pressurized contact therewith.

In the above liquid applying apparatus, the distance between the respective adjacent pressurizedly contacting portions is made smaller toward the end portions of the object to be liquid-applied which is apt to be put in a state of floating up from the liquid applying member due to the occurrence of curling by applying the liquid, and the object is pressed to the liquid applying member with many pressurizedly contacting portions.

In a seventeenth status of the embodiment relating to the sixth to sixteenth statuses, the object tc be liquid-applied is brought into surface contact with the liquid applying member.

In the above liquid applying apparatus, owing to the surface contact, the object to be liquid-applied can continue to come into contact with the liquid applying member for a longer time period, compared with the case of the line contact.

In an eighteenth status of the embodiment relating to the sixth to sixteenth statuses, the object to be liquid-applied is pressed to the liquid applying member by the action of rigidity of the object to be liquid-applied.

In the above liquid applying apparatus, the object to be liquid-applied is pressed to the liquid applying member not only by the contact member but by the action of the rigidity of the object itself.

In a nineteenth status cf the embodiment relating to the sixth to eighteenth statuses, the contact angle formed between the contact member and water is equal to or larger than 90°.

In the above liquid applying apparatus, the sufficiently unwettable material has the contact angle of 90° or more therebetween. Consequently, it is possible to prevent the liquid of the liquid applying member from being attached to the contact member at the time of finishing the liquid applying to the object to be liquid-applied and further the liquid goes around into the flow path of the liquid applying member.

The image forming substance removing apparatus of a twentieth status of the embodiment for removing image forming substance from a sheet-state image carrier, to the surface of which said image forming substance is stably attached includes:

a liquid applying apparatus as defined in any one of the first through nineteenth statuses of the embodiment, and image forming substance removing means brought into contact with the image carrier put in a state of being liquid-applied by use of the liquid applying apparatus with unstabilizing liquid for unstabilizing the attaching state of the image forming substance to the image carrier, for removing the image forming substance.

In the above image forming substance removing apparatus, the liquid applying apparatus for realizing the preferable and uniform applying of the liquid as mentioned in the first through nineteenth statuses of the invention is employed, the applying liquid for making unstable the applying state of the image forming substance is applied to the image carrier, and the image forming substance, the attaching state of which becomes unstable, is removed from the image carrier by use of the image forming substance removing means.

Embodiments of the Invention:

First Embodiment

A first embodiment of the present invention applicable to an image forming substance removing apparatus (hereinafter, called "toner removing apparatus") for removing thermo-fusable toner (hereinafter, called "toner") employed as an image forming substance from a transfer paper employed as an object to be liquid-applied or an image carrier having an image formed thereon by use of a transfer-type electrophotographic copying machine is explained hereinafter. In this toner removing apparatus, see FIG. 1, a liquid supplying unit 30 described later corresponds to the liquid applying apparatus according to the present invention.

Figure 1:
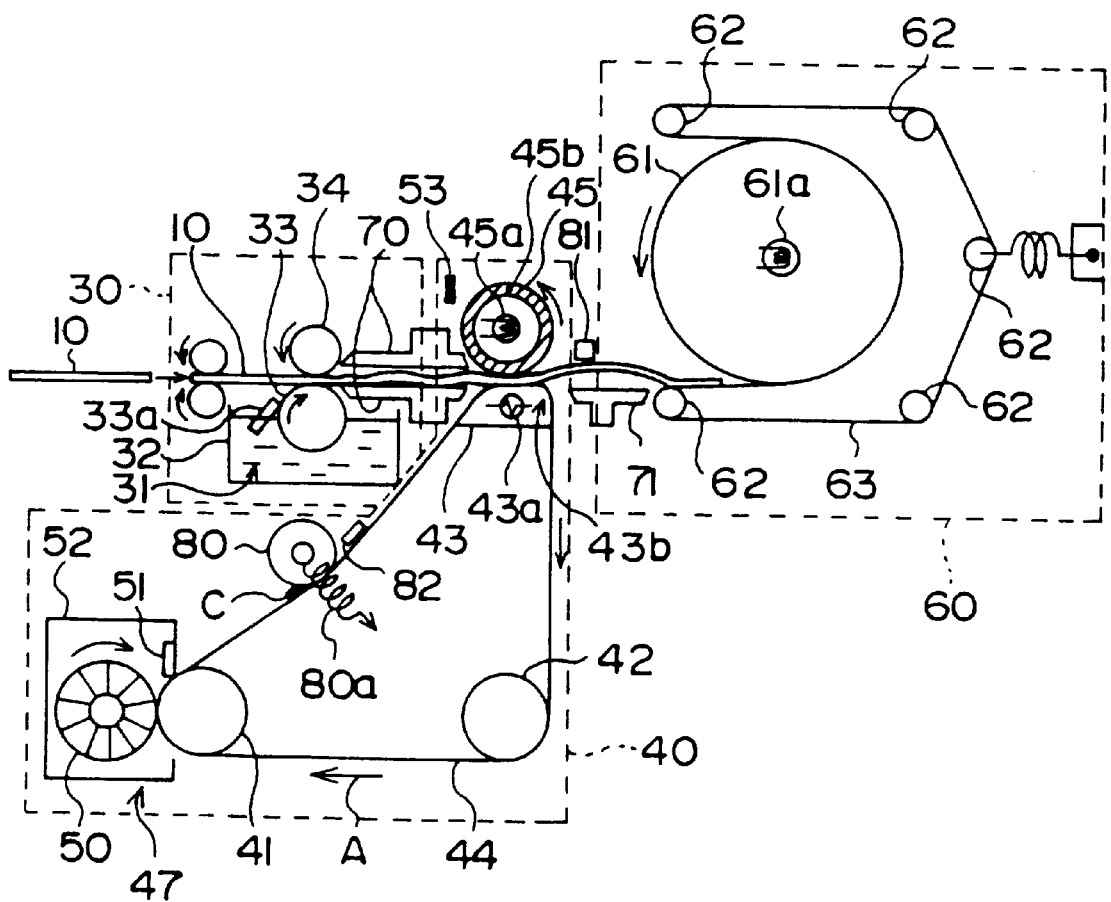
FIG. 1 is a front view showing the outlined construction of the image forming substance removing apparatus relating to a first embodiment of the present invention.

At first, the outline of the toner removing apparatus relating to the first embodiment is explained hereinafter. As shown in FIG. 1, this toner removing apparatus includes a liquid supplying unit 30 for supplying a liquid 31 to a transfer paper 10 transported from a paper feeding unit omitted in FIG. 1, a toner peeling-off unit 40 employed as an image forming substance removing means for peeling off and removing the toner from the transfer paper 10 supplied with liquid 31, a drying unit 60 for drying the transfer paper 10 having the toner removed therefrom, and a paper receiving unit omitted in FIG. 1 for receiving the transfer paper 10 discharged from the drying unit 60. The above-mentioned liquid 31 corresponds to applying liquid or unstabilizing liquid.

The above-mentioned paper feeding unit for feeding paper directs to the lower direction the surface having the toner image formed thereon (hereinafter, called "toner image surface"), and sends out the transfer paper 10 sheet by sheet to the liquid supplying unit 30. For instance, the paper feeding unit is the same as the paper feeding unit employed in an electrophotographic copying machine.

The above-mentioned liquid supplying unit 30 supplies to the transfer paper 10 the liquid 31 such as a water solution or a water containing a surface active agent in order to improve the permeability of the transfer paper 10, and the same unit 30 includes a liquid container 32 for containing the liquid 31, an applying roller 33 employed as an unstabilizing liquid applying member, a blade 31a for adjusting the amount of the liquid 31 pumped up by the applying roller 33 from the liquid container 32, and a restriction (pressing) roller (hereinafter, called "restriction roller") 34 employed as a contact member. The applying roller 33 is provided so as to be partially dipped into the liquid 31 contained in the liquid container 32. The surface thereof moves endlessly. Namely, the liquid 31 is pumped up by the action of the applying roller's 33 rotation. The blade 31a adjusts the amount of pumped-up liquid and supplies the liquid 31 onto the toner image surface of the transfer paper 10. The restriction roller 34 is provided so as to interpose the paper transporting path therebetween and to oppose the applying roller 33, and the roller 34 brings the sheet material 10 into contact with the applying roller 33. The liquid supplying unit 30 is explained later in detail.

The above toner peeling-off unit 40 includes:
- a toner offset belt 44 (hereinafter, called "offset belt") employed as a peeling-off member in a state of an endless belt,
- a driving roller 41, a tracking roller 42, and a heating block 43, respectively employed as a plurality of supporting members for supporting the offset belt 44 so the belt 44 is able to move endlessly,
- a heating roller 45 employed as a pressurizing member disposed at a position of interposing the offset belt 44 therebetween and bringing that mutually into pressurizing contact with the heating block 43,
- a removing roller 80 employed as a removing medium for removing residual liquid mass from the surface of the offset belt 44.

Furthermore, a heater 45a is provided in the interior of the heating roller 42. And further, a driving source for transporting the driving force to the roller is mounted on the driving roller 41.

At least the surface of the above-mentioned offset belt 44 is formed with a material having a larger attaching force than that between the surface of the transfer paper 10 and the thus softened toner. For instance, the belt itself may be formed with a metal material such as aluminum, copper, nickel, etc., and an alloy thereof or high polymer material such as polyethylene terephthalate (PET) or the like into which titanium oxide is dispersed.

The corner portion 43b at the lower stream side in the transfer paper transporting direction of the above heating block 43 is formed in a state of almost 90°.

The moving direction of the above offset belt 44 passing therethrough is sharply changed at the corner portion 43b, and thereby the transfer paper 10 is separated with a curvature from the offset belt 44.

And further, the heating block 43 and the above-mentioned heating roller 45 tightly attach the toner image surface of the transfer paper 10 transported from the above liquid supplying unit 30 to the offset belt 44 and soften by heating the toner tightly fixed on the transfer paper 10.

And further, the above belt cleaning apparatus 47 includes a rotating brush roller 50 for removing the toner attached on the circumferential surface of the offset belt 44 by exerting an intermittent scratching force thereon and a blade 51 made of metal or resin for removing the toner. In such a construction, the toner removed from the circumferential surface of the belt can be contained in the toner casing 52.

Moreover, an upper guide plate 70 for guiding the transfer paper 10 to the pressurizing portion with the heating roller 45 is provided in the toner peeling-off unit 40, and a lower guide plate 71 for guiding the transfer paper 10 separated with curvature from the offset belt 44 around the lower stream side corner 43c of the heating block 43 to the drying unit side 60 is further provided in the toner peeling-off unit 40.

The above drying unit 60 is, for instance, one for drying the transfer paper 10 so as to make the amount of holding of the unstabilizing liquid by the transfer paper 10 less than 10% of the paper weight and the same is constructed with a heating drum 61, for example, made of aluminum including a heating lamp 61a therein and a paper pressurizing belt 63 suspended on plural supporting rollers 62 and endlessly moving in a state of being wound by a constant angle around the circumferential surface of the heating drum 61. In the embodiment shown in FIG. 1, one supporting roller 62 serves also as a tension roller. As the material employed for the above paper pressurizing belt 63, it is possible to use a material having heat-proofness or easy ventilation, for instance, canvas cloth, cotton cloth, Tetoron cloth, etc.

The above-mentioned paper receiving unit can be constructed with upper and lower guide members for guiding the transfer paper 10 coming out from the interposing area between the heating drum and the paper pressurizing belt, a pair of paper discharging rollers for transporting the transfer paper 10 guided by the guide member, and a tray for receiving the transfer paper discharged by the pair of paper discharging rollers.

In the afore-mentioned construction, the transfer paper 10 sent out from the paper feeding unit is supplied with the liquid 31 on the toner image surface thereof by the liquid supplying unit, and the paper 10 is sent to a toner peeling-off unit 40. The toner firmly attached to the transfer paper 10 due to heating by the heating block 43 and the heating roller 45 is softened in the above toner peeling-off unit 40, and the softened toner is attached to the surface of the offset belt 44. And then, when the transfer paper 10 is separated from the offset belt 44 around the downstream-side corner portion 43b of the heating block 43, the toner attached to the surface of the offset belt 44 is peeled off from the transfer paper 10. Thereby, the toner is removed from the transfer paper 10. The transfer paper 10, from which the toner is removed, is then dried by the drying unit (heating drum) 61 and is discharged onto the paper receiving unit.

According to the above-mentioned construction, since the liquid 31 is supplied to the transfer paper 10 having the toner attached thereto and the toner is peeled off in a state of infiltrating the liquid 31 into the boundary surface portion between the transfer paper 10 and the toner, the toner can be removed from the transfer paper 10 without injuring the fiber of the paper.

Furthermore, the apparatus according to the present invention as mentioned heretofore can be installed in an office, because a solvent which exerts a bad influence on the human body or in the environment is not employed at all in the above apparatus.

Regarding the toner removing apparatus described heretofore in brief, the liquid supplying unit 30 is further explained.

Figure 2:
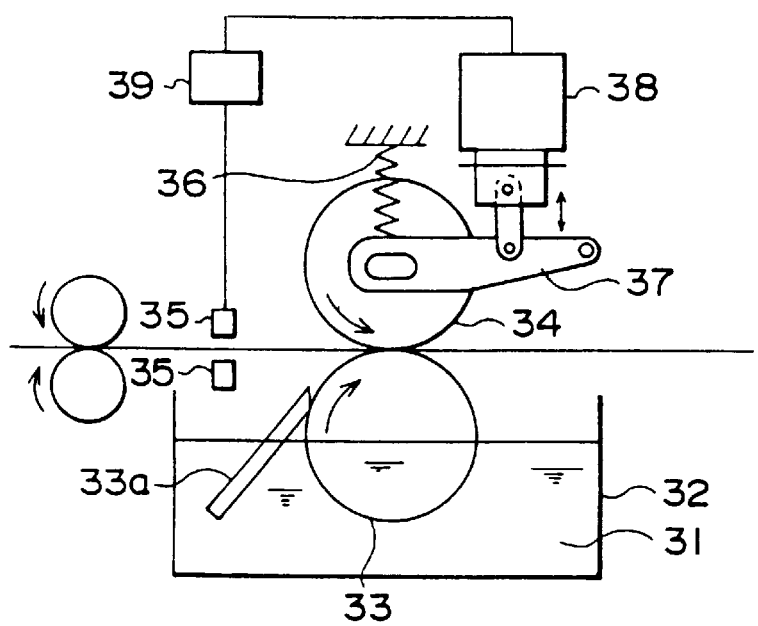
FIG. 2 is a front view showing the outlined construction of the liquid supplying unit of the image forming substance removing apparatus.

FIG. 2 is a front view showing an outlined construction of the liquid supplying unit 30. As mentioned previously, the liquid supplying unit 30 includes a liquid container 32 for containing the liquid 31 therein, an applying roller 33, a blade 33a, and a restriction roller 34. In addition to those elements, the liquid supplying unit 30 further includes:

- a tip end sensor 35 for detecting the tip end portion of the transported transfer paper 10,
- an energizing member 36 such as spring or the like for energizing the restriction roller 34 in a direction of departing from the applying roller 33,
- a movable bearing 37 firmly fixed on the rotatable shaft of the restriction roller 34,
- a solenoid 38 for moving the restriction roller 34 to a position of coming into contact with the applying roller 35 against the energization of the energizing member 36, and
- a control chip 39, etc.

In such a construction as mentioned above, the energizing member 36, the movable bearing 37, and the solenoid 38 construct moving means for moving the restriction roller 34 within the area between an operating position (position shown in FIG. 2) interposing the transfer paper 10 with the applying roller 33 and the restriction roller 34 and a separating or departing position where the distance between the applying roller 34 and the restriction roller 34 is made large, and the control chip 39 forms a movement controlling unit.

In such a liquid supplying unit 30, when the transferring paper 10 is transported thereto, the tip end portion of the paper 10 is detected by the transfer paper's tip end sensor and the detection signal is sent to the control chip 39, And then, the control chip 39 drives the solenoid 38, and the solenoid 38 thus driven moves the restriction roller 34 to the operating position through the movable bearing 37. And then, at the time point when the setting time previously memorized in the control chip 39 elapses starting from the time of detecting the tip end of the transfer paper 10 by use of the transfer paper's tip end sensor 35, the control chip 39 turns off the driving of the solenoid 38, and thereby the restriction roller 33 is moved to the departing position by the action of the energization by the energizing means 36.

Next, the concrete timing of moving the restriction roller 34 within the space between the operating position and the departing position is described below.

The timing is determined such that, during the time period of applying the liquid 31 onto the transfer paper 10 by use of the applying roller 33, the restriction roller 34 is positioned at the operating position. On the other hand, during the time period longer than a predetermined constant time period after completing the applying of the liquid 31 onto the sheet material 10 and until starting the applying of the liquid 31 onto the next sheet material 10, the restriction roller 34 is positioned at the departing position. Hereupon, the above constant time period is determined such that, at the time point of starting the applying of the liquid 31 onto the next sheet material, there appears no residual liquid mass formed by the liquid 31 near the position where the applying roller 33 and the restriction roller 34 are brought into adjacent contact with each other.

And further, it is desirable to determine the timing of moving the restriction roller 34 within the area between the operating position and the departing position such that the restriction roller 34 is positioned at a driving position during the time period after completing the applying of the liquid 31 to the sheet material 10 and before the predetermined time starting from the time point of applying the liquid 31 to the next sheet material 10.

If the restriction roller 34 is moved with such a timing as mentioned above, the liquid 31 is applied to the restriction roller 34 from the applying roller 33 prior to the applying of the liquid 31 to the transfer paper 10.

Consequently, the liquid 31 turns out to be applied to not only the surface of the transfer paper at the side of coming into contact with the applying roller 33, but also at the surface thereof at the side of coming into contact with the restriction roller 34. Thereby, the liquid 31 is applied only to the surface of the transfer paper 10 at the side of coming into contact with the restriction roller 34. As a result, the transfer paper 10 is prevented from the occurrence of curling of the transfer paper 10 due to the expansion of the paper fiber only at the side of coming into contact with the applying roller 33.

Figure 3:
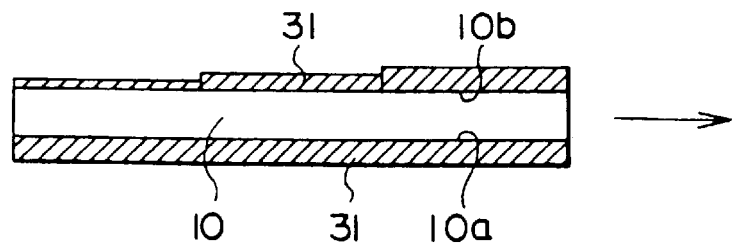
FIG. 3 is a cross sectional view for explaining the transfer paper applied with the unstabilizing liquid by the liquid supplying unit.

FIG. 3 shows diagrammatically the transfer paper 10 applied with the liquid 31 on the both surfaces thereof. As shown in FIG. 3, the liquid 31 is uniformly applied from the applying roller 33 to the surface 10a at the side of coming into contact with the applying roller 33 of the transferring paper 10. On the other hand, the amount of the liquid 31 applied to the surface lob of the transfer paper 10 at the side of coming into contact with the restriction roller 34 turns out to be small in proportion to the number of times of bringing the restriction roller 34 into contact with the transfer paper 10.

And further, it is desirable to attach a liquid absorbing material such as a sponge, etc. to the surface of the restriction roller 34. If such a liquid absorbing material is attached thereto, the liquid 31 applied by the liquid supplying (applying) roller 33 is stored in the liquid absorbing material. The stored liquid 31 is discharged at one time, and since the liquid 31 is not applied to only the partial area of the transfer material 10 the liquid 31 turns out to be applied uniformly and surely to the entire area of the surface of the transfer sheet material 10 at the side of coming into contact with the contacting member.

Consequently, the afore-mentioned curling phenomenon can be prevented effectively.

Figure 4:
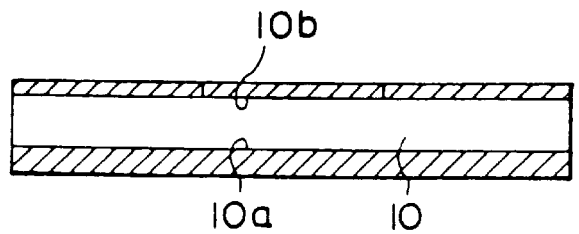
FIG. 4 is a cross sectional view for explaining the transfer paper applied with the unstabilizing liquid by a modification of the liquid supplying unit of the first embodiment.

FIG. 4 shows diagrammatically the transfer paper 10, on the surface of which a liquid absorbing material is formed, and which is applied with the liquid 31 by the restriction roller 34 and the (liquid) supplying roller 33. As shown in FIG. 4, if the liquid absorbing material is formed on the surface of the restriction roller 34, the liquid 31 is also applied uniformly to the surface 10b of the transfer paper 10 at the side of coming into contact with the restriction roller 34.

And further, even when the transfer paper 10 is not transported and the liquid 31 is not applied to the transfer paper 10, if both of the liquid supplying roller 33 and the restriction roller 34 are rotated, the liquid 31 is applied to the restriction roller 34 from the above liquid supplying roller 33. At this time, the liquid is applied successively onto the circumferential surface of the restriction roller 34. For this reason, the liquid 31 can be applied more surely to the transfer paper 10 from the restriction roller 34. And further, on this occasion, before the liquid 31 is started to be applied to the next transfer paper 10, the restriction roller 34 is moved to the driving position in a state of bringing the restriction roller 34 into contact with the applying roller 33 with the timing of rotating by one or more times, and thereby the liquid 31 can be applied to the overall circumferential surface of the restriction roller 34. Consequently, the applying of the liquid 31 onto the transfer paper 10 can be done with further certainty.

Moreover, before starting the applying of the liquid 31 onto the transfer paper 10, it is desirable to rotate the restriction roller 34 by several times in a state of bringing the restriction roller 34 into contact with the applying roller 33. In the case of not forming the liquid absorbing material on the surface of the restriction roller 34, the number of rotating times of the roller 34 may be "one". On the other hand, in the case of forming that thereon, the number of rotating times of the roller 34 may be "three". The above number is confirmed by experiment, etc. If the number of rotations is smaller than the above, the amount of the liquid 31 applied onto the transfer paper 10 may become nonuniform on some occasions. On the other hand, if the number of rotations are larger than the above, the amount of the liquid 31 applied onto the restriction roller 34 may become excessive, and thereby there appears a residual liquid mass formed by the liquid 31 on the place near the portion of the boundary area between the applying roller 33 and the restriction roller 34.

Figure 5:
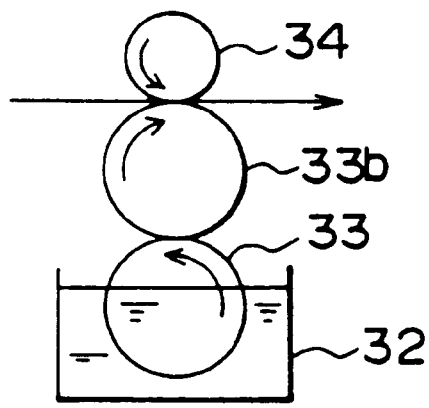
FIG. 5 is a front view showing the outlined construction of the liquid supplying unit which is a second modification of the liquid supplying unit of the first embodiment.

And further, it is also possible to adopt the construction in which, as the liquid supplying unit 30, a second applying roller 33b is interposed between the applying roller 33 and the restriction roller 34 as shown in FIG. 5, and the liquid 31 pumped up by the applying roller 33 is applied to the transfer paper 10 through the above second applying roller 33b.

And further, in the embodiment as mentioned heretofore, the mechanism for changing the position of the restriction roller 34 in a state of fixing the position of the applying roller 33 as the moving means for moving the applying roller 33 employed as the member for applying the liquid 31 and the restriction roller 34 employed as the contact member between the operating position and the departing position has been shown heretofore. However, the present invention is also applicable to a mechanism for changing the position of the applying roller 33 in a state of fixing the position of the restriction roller 34, and further the present invention is also applicable to a mechanism for changing positions of both the applying roller 33 and the restriction roller 34.

Second Embodiment

A second embodiment of the present invention applicable to an image forming substance removing apparatus (hereinafter, called "toner removing apparatus") for removing thermo-fusable toner (hereinafter, called "toner") employed as an image forming substance from a transfer paper employed as an object to be liquid-applied or an image carrier having an image formed thereon by use of a transfer-type electrophotographic copying machine is explained hereinafter. And further, regarding the second embodiment, the construction of the liquid supplying unit differs from that of the first embodiment. However, both of the embodiments have a common construction for the other parts except for the liquid supplying unit. Therefore, in the second embodiment, only the liquid supplying unit is explained.

Figure 6:
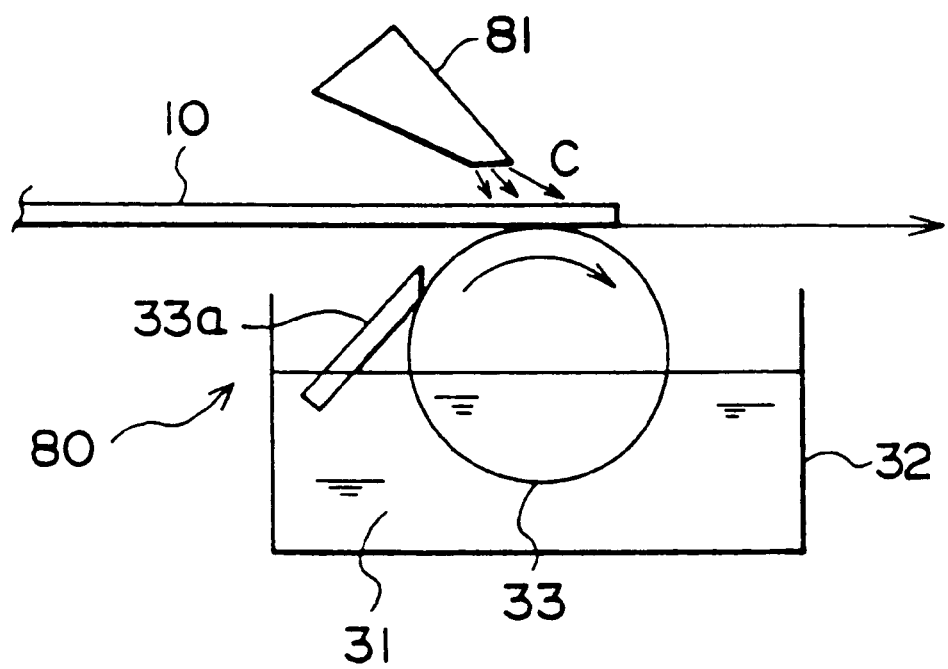
FIG. 6 is a front view showing the outlined construction of the liquid supplying unit of the image forming substance removing apparatus of a second embodiment of the present invention.

FIG. 6 is a front view showing an outlined construction of the liquid supplying unit 80 of the second embodiment. The liquid supplying unit 80, as in the case of the liquid supplying unit 30 explained in the first embodiment, includes:

a liquid container 32 for containing an unstabilizing liquid 31 therein, an applying roller 33 provided in a liquid container 32 so as to be partly dipped in the unstabilizing liquid 31 contained in the liquid container 32, for pumping up the unstabilizing liquid 31 by endlessly moving the surface thereof and supplying the pumped-up unstabilizing liquid 31 to the transfer paper 10, and a blade 31a for adjusting the amount of the unstabilizing liquid 31 pumped up by the applying roller 33.

And further, the liquid supplying unit 80 includes an air flow nozzle 81 disposed at a position departed from the applying roller 33 so as to oppose the applying roller 33 by interposing the transporting path for transporting the transfer paper 10. The air flow nozzle 81 serves as air flow generating means for bringing the transfer paper 10 employed as a sheet material into contact with the applying roller 33 by generating the air flow toward the applying roller 33 (in the direction of an arrow C shown in FIG. 6). As the air flow generated by the air flow nozzle, for instance, air, nitrogen gas, etc. are used.

And further, the liquid supplying unit 80 includes a transfer paper's tip end sensor 88 for sensing the tip end of the transported transfer paper 10 and a control chip 89 for starting the occurrence of the air flow from the air flow nozzle 81 with a predetermined timing in accordance with the tip end detection signal from the sensor and for stopping the occurrence of the air flow. In such a construction, it is desirable to determine the above timing, such that the air flow is generated only during a time period when the applying roller 33 and the transfer paper 10 are put at the position of coming into contact with each other, while the occurrence of the air flow is stopped during another time period when the applying roller 33 does not come into contact with the transfer paper 10. 10 Assuming that the air flow is generated or stopped with such a timing, both of the transfer paper 10 and the applying roller 33 are put in a state of coming into sure contact with each other, during the time period when the unstabilizing liquid 31 is applied to the transfer paper 10 from the applying roller 33, and further it is possible to prevent drying of the applying roller 33 caused by the direct collision of the air flow onto the applying roller 33.

And further, it is desirable to determine the direction of the air flow so as to have a component of the direction of transporting the transfer paper 10. If the air flow of such a direction is employed, the transferring paper 10 can be transported smoothly.

And further, it is desirable to mix the vapor or steam of the unstabilizing liquid 31 with the air flow generated by the nozzle 81. If such air flow is employed, not only the unstabilizing liquid 31 is applied to the surface at the side of the transfer paper 10 brought into contact with the applying roller 33, but water or the unstabilizing liquid 31 is applied even to the surface at the side of colliding with the air flow. Consequently, the curling of the transfer paper 10 due to the expansion of only the fiber at the side of the transfer paper 10 brought into contact with the applying roller 33 can be prevented.

Figure 7:
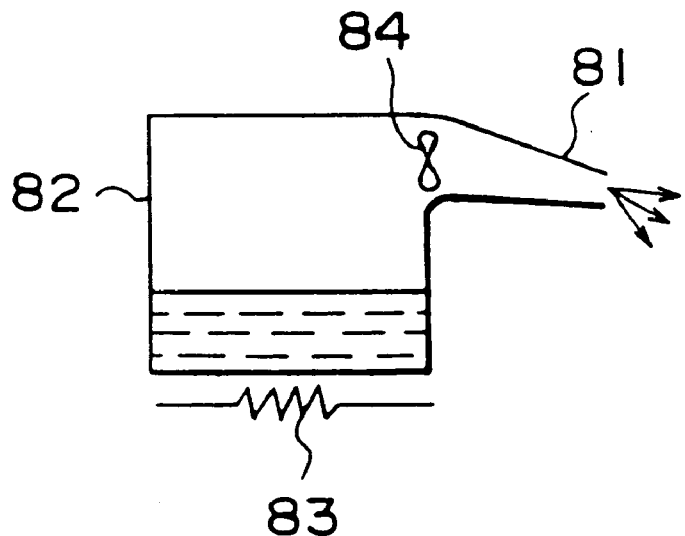
FIG. 7 is an explanatory diagram showing the outlined construction of the vapor generating apparatus of the image forming substance removing apparatus.

FIG. 7 shows an outlined construction of a vapor generating apparatus for generating the vapor to be mixed with the air flow. The vapor generating apparatus is constructed with:

- a case 82 being connected with the air flow nozzle 81 and containing therein water or the unstabilizing liquid,
- a heating medium 83 constructed with, for instance, a heating wire for heating water or the unstabilizing liquid 31 through the case 82, and
- a fan for transporting the vapor generated by heating toward the air flow nozzle 81.

Furthermore, it is allowable to mix fine liquid particles of water or fine liquid particles of the unstabilizing liquid 31, instead of the vapor of the unstabilizing liquid 31 or steam, to the air flow issuing from the nozzle 81. In the case of employing such air flow, water or the unstabilizing liquid 31 is applied to the surface of the transfer paper 10 at the side of receiving the air flow colliding therewith, and thereby the curling of the transfer paper 10 can be prevented.

Figure 8:
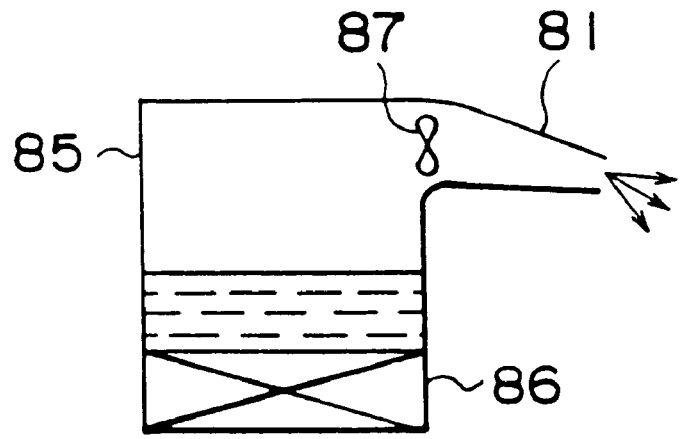
FIG. 8 is an explanatory diagram showing the outlined construction of the fine particle generating apparatus of the image forming substance removing apparatus.

FIG. 8 shows an outlined construction of a fine particle generating apparatus for generating fine particles of water or fine agent particles of the unstabilizing liquid 31 to be mixed with the air flow.

The above fine particle generating apparatus connected with the air flow nozzle 81 includes:

- a case 85 for containing water or the unstabilizing liquid 31 in the interior thereof,
- an ultrasonic vibrator 86 for applying ultrasonic vibration to water or the unstabilizing liquid 31 through the case 85, and
- a fan 87 for transporting the fine liquid particle generated by applying the ultrasonic vibration thereto to a direction toward the air flow nozzle 81.

Third Embodiment

A third embodiment of the present invention applicable to an image forming substance removing apparatus (hereinafter, called 'toner removing apparatus") for removing thermo-fusable toner (hereinafter, called "toner") employed as an image forming substance from a transfer paper employed as an object to be liquid-applied or an image carrier having an image formed thereon by use of a transfer-type electrophotographic copying machine is explained hereinafter.

Regarding the third embodiment, the construction of the construction supplying unit differs from that of the first embodiment. However, both of the embodiments have a common construction for the other parts except for the liquid supplying unit. Therefore, in the third embodiment, only the liquid supplying unit is explained.

FIG. 9 shows an outlined construction of the liquid supplying unit 90 of the third embodiment.

Figure 9A:
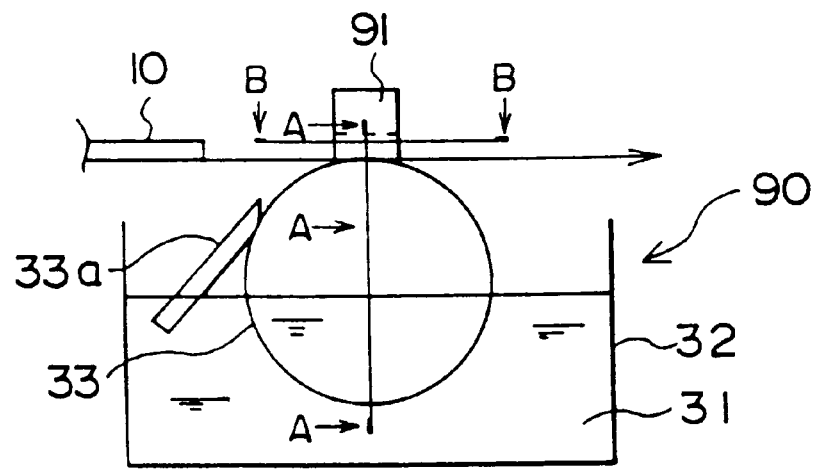
FIG. 9a is a front view showing the outlined construction of the liquid supplying unit provided in the image forming substance removing apparatus of a third embodiment of the present invention.
Figure 9B:
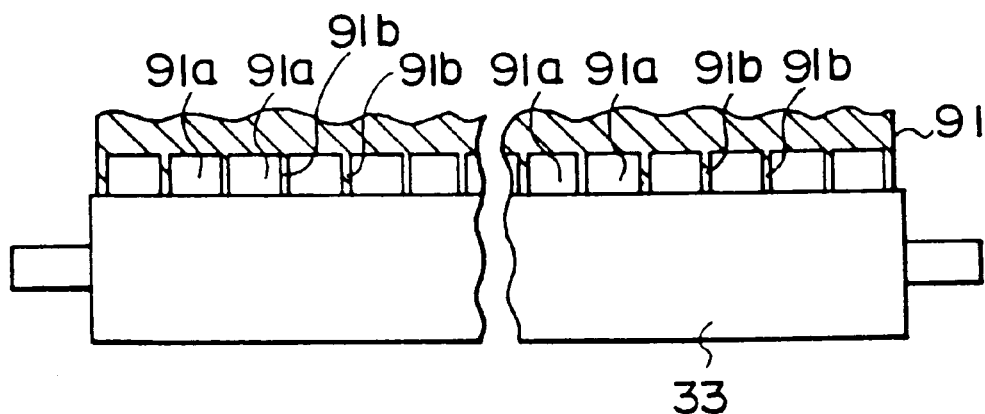
Figure 9C:
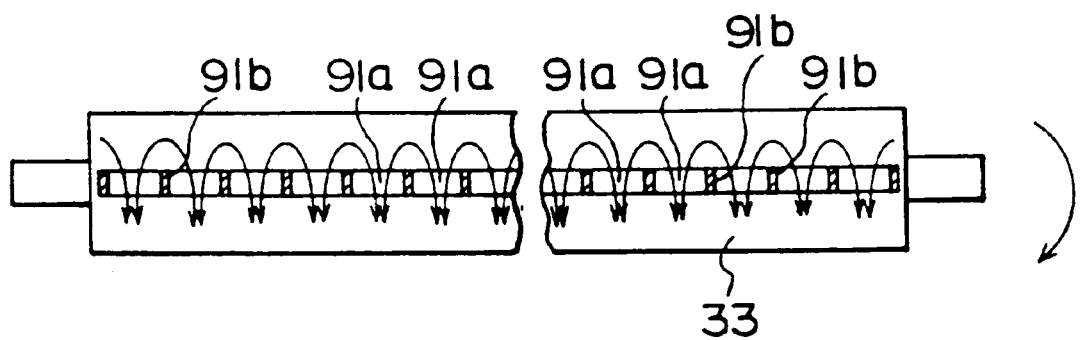

FIG. 9a is a front view showing the outlined construction of the above unit 90, FIG. 9b is a cross-sectional view taken along the line A—A in FIG. 9a, and FIG. 9c is a cross-sectional view taken along the line B—B in FIG. 9a.

The liquid supplying unit 90 includes, as in the case of the liquid supplying unit 30 explained in the first embodiment, the liquid container 32 for containing the unstabilizing liquid 31, the applying roller 33 provided in the stabilizing liquid 31 contained in the liquid container 32 so as to be partly dipped therein and having the surface thereof moving endlessly, for pumping up the unstabilizing liquid 31 from the liquid container 32 and supplying the unstabilizing liquid 31 to the transfer paper 10, and the blade 33a for adjusting the amount of the unstabilizing liquid 31 pumped up by the applying roller 33. The liquid supplying unit 90 further includes a contacting member 91 for bringing the transfer paper 10 into contact with the applying roller 33 at the position of passing through the transporting path and opposing the applying roller 33. The above contacting member 91 includes an unstabilizing liquid flow path portion 91a in a direction parallel with the direction of moving the surface of the applying roller 33 and a pressurizing portion 91b for pressurizing the transfer paper 10 to the applying roller 33.

Regarding the above liquid supplying unit 90, the unstabilizing liquid 31 overflows through the flowing path portion 91a at the place near the position of the applying roller 33 brought into contact with the contact member 91 as shown by the arrow in FIG. 9c. Consequently, it is possible to prevent the occurrence of the liquid mass including the unstabilizing liquid 31 at the place near the position of the applying roller 33 brought into contact with the contact member 91.

Figure 10:
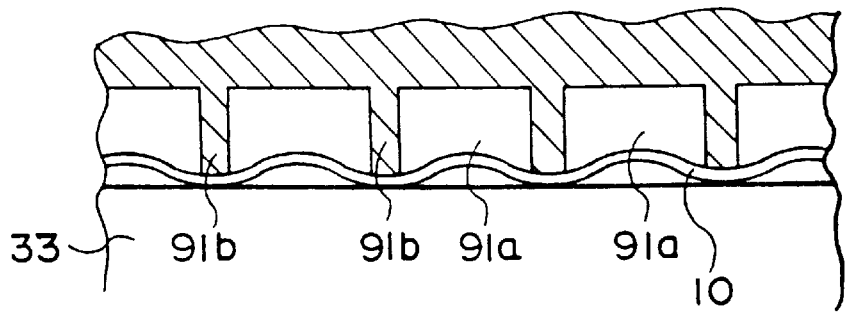
FIG. 10 is an enlarged explanatory diagram showing the state of the transfer paper's waving in FIG. 9.

According to the apparatus mentioned heretofore, the transfer paper 10 is pressed only at the place that the paper 10 is brought into contact with the pressurizing portion 91b, while the transfer paper 10 is not pressed at the place that the paper 10 is brought into contact with the flow path portion 91a. For this reason, the expansion of the transfer paper 10 does not occur at the portion of the paper 10 pressed by the pressurizing portion 91b. However, at the portion of the paper 10 brought into contact with the flow path portion 91a, the expansion of the paper 10 sometimes occurs due to the expansion of the paper fiber. Consequently, the waving of the transfer paper 10 occurs. FIG. 10 is an enlarged view of FIG. 9b explaining the state of the occurrence of the waving on the transfer paper 10.

In order to prevent the occurrence of such waving of the transfer paper 10, it is effective to arrange plural contact members in parallel with the direction of the movement of the applying roller's 33 surface. FIG. 11 is an outlined view showing the construction of the liquid supplying unit 90 having two contact members provided therein.

Figure 11A:
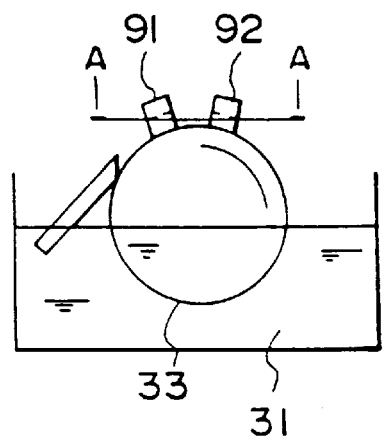
FIG. 11a is a front view showing the outlined construction of a modification of the liquid supplying unit.
Figure 11B:
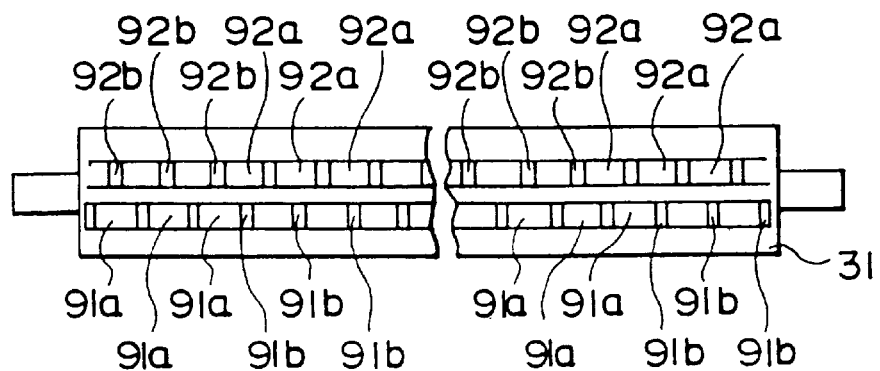

FIG. 11a is a front view of the above unit 90, and FIG. 11b is a cross-sectional view taken along the line A—A in FIG. 11a. The liquid supplying unit 90 includes a (first) contact member 91 at the upstream side of the direction of transporting the transfer paper 10 and a (second) contact member 92 at the downstream side thereof. And further, the contact member 91 includes an unstabilizing liquid flow path portion 91a in parallel with the direction of the movement of the applying roller's 33 surface and a pressurizing portion 91b for bringing the transfer paper 10 into pressurized contact with the applying roller 33. The second contact member 92 includes, as in the case of the contact member 91, the unstabilizing liquid flow path portion 92a and the pressurizing portion 92b. And further, in the case of assembling the (first) contact member 91 and the (second) contact member 92, the unstabilizing liquid flow path portions 91a and 92a are assembled so as to be formed respectively on different positions in the direction perpendicular to the movement direction of the applying roller's 33 surface, and the pressurizing portions 91b and 92b are assembled so as to press the transfer paper 10 on the different positions thereof in the same direction (perpendicular to the applying roller's surface movement direction, see FIG. 11b).

In such a manner, if the plural contact members 91, 92 are disposed as mentioned above, the transfer paper 10 becomes flat at the time of applying the unstabilizing liquid 31 thereon. Consequently, it is possible to prevent the waving of the transfer paper 10 which may possibly occur in the case of disposing only one contact member in the paper transporting direction.

And further, in the above apparatus, it is allowable to provide the liquid supplying material 91c made of, for instance, a sponge, etc. on the surface of the pressurizing portion 91b at the side of being brought into contact with the transfer paper 10. If such a structure is adopted, the unstabilizing liquid 31 absorbed (sucked) by the liquid absorbing material 91c turns out to be applied even on the portion brought into contact with the pressurizing portion 92 on the surface of the transfer paper 10 at the side of coming into contact with the contact member 91.

Figure 12:
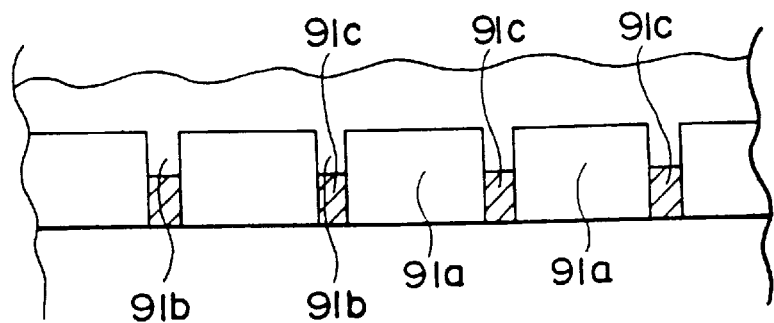
FIG. 12 is an explanatory diagram showing the outlined construction of the contact member of a second modification of the liquid supplying unit.

For this reason, not only the fiber of the transfer paper 10 on the surface thereof at the side of coming into contact with the applying roller 33, but also the fiber of the transfer paper 10 on the surface thereof at the side of coming into contact with the contact member 91 expands, and thereby the occurrence of the curling of the transfer paper 10 is prevented, as shown in FIG. 12.

Figure 13:
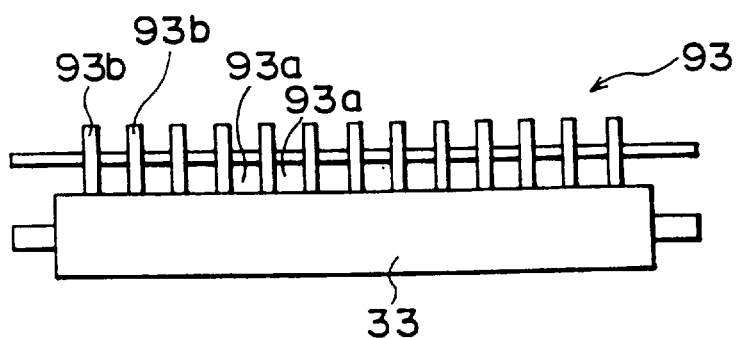
FIG. 13 is an explanatory diagram showing the outlined construction of the contact member of a third modification of the liquid supplying unit.

And further, in the above apparatus, it is allowable to employ the spur roller 93 as shown in FIG. 13 serving as the contact member. The above spur roller 93 forms the pressurizing portion 93b for bringing the transfer paper 10 into pressurized contact with the applying roller 33 at the spur portion, and the space between the respective spur rollers forms the unstabilizing liquid flow path 93a in the direction parallel with the movement direction of the applying roller's 33 surface.

Figure 14:
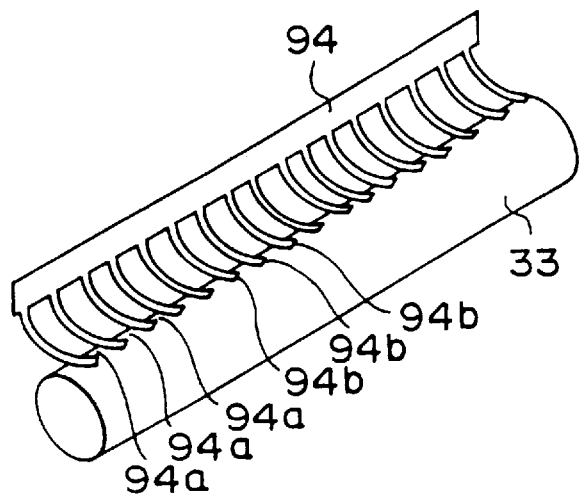
FIG. 14 is an explanatory diagram showing the outlined construction of the contact member of a fourth modification of the liquid supplying unit.

And further, in the above apparatus, it is allowable to employ the comb-like member 94 as shown in FIG. 14 serving as the contact member. The above comb-like member 94 forms the pressurizing portion 94b for bringing the transfer paper 10 into pressurized contact with the applying roller 33 at the comb teeth portion, and the space between the respective comb teeth portions forms the unstabilizing liquid flow path 94a in the direction parallel with the movement direction of the applying roller's 33 surface.

If the spur roller 93 or the comb-like member 94 is employed as the contact member, the mechanical processing becomes easy and the manufacturing cost is lowered, for instance, in comparison with the case of employing the contact member for forming the unstabilizing liquid flow path.

Fourth Embodiment

A fourth embodiment of the present invention applicable to an image forming substance removing apparatus (hereinafter, called "toner removing apparatus") for removing thermo-fusable toner (hereinafter, called "toner") employed as an image forming substance from a transfer paper employed as an object to be liquid-applied or an image carrier having an image formed thereon by use of a transfer-type electrophotographic copying machine is explained hereinafter. Regarding the fourth embodiment, the construction of the liquid supplying unit differs from that of the first embodiment. However, both of the embodiments have a common construction for the other parts except for the liquid supplying unit. Therefore, in the fourth embodiment, only the liquid supplying unit is explained.

FIG. 15 is a diagram showing the outlined construction of the liquid supplying unit 30 according to this embodiment.

Figure 15A:
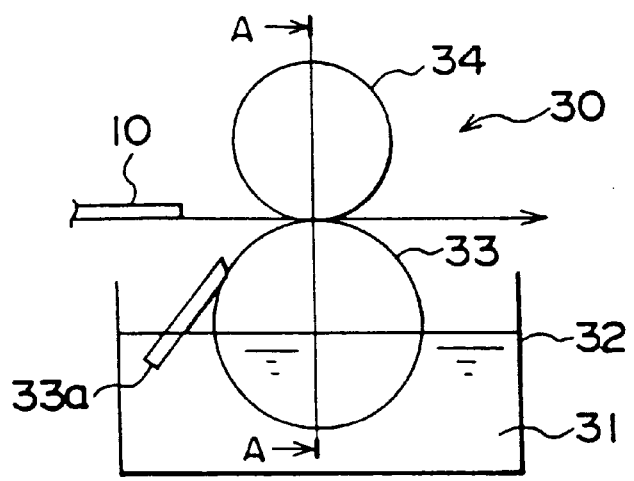
FIG. 15a is a front view showing the outlined construction of the liquid supplying unit provided in the toner removing apparatus of a fourth embodiment of the present invention.
Figure 15B:
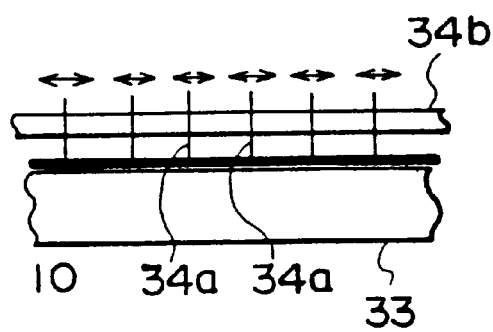
Figure 15C:
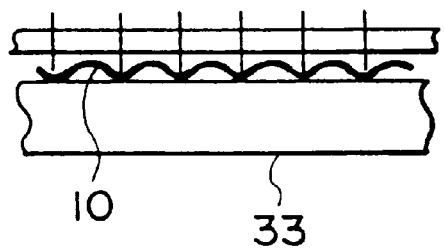

FIG. 15a is a front view showing the outlined construction of the above unit, and FIG. 15b is cross-sectional view taken along the line A—A in FIG. 15a. The liquid supplying unit 30 includes, as mentioned previously, a liquid container 32 for containing the liquid 31, an applying roller 33 for pumping up the liquid 31 and supplying the liquid 31 to the transfer paper 10, a blade 33a for adjusting the amount of the liquid 31 pumped up by the applying roller 33, and a restriction roller 34 for bringing the transfer paper 10 into contact with the applying roller 33. The explanation of the restriction roller 34 is added hereto.

As shown in FIG. 15b, the restriction roller 34 is constructed with plural disks 34a and a shaft 34b for supporting the respective disks 34a such that these disks 34a are arranged adjacently to each other and the same can be slid in a direction of departing from each other as shown in FIG. 15b. And further, in the restriction roller 34 the respective disks 34a function as a pressurizing portion for bringing the transfer paper 10 into pressurized contact with the applying roller 33, and the space between the respective disks 34a function as an applying liquid flow path in parallel with the movement direction of the applying roller's 33 surface. According to this liquid supplying unit 30, the liquid 31 overflows from the place near the boundary location between the applying roller 33 and the restriction roller 34 through the space between the respective disks 34a. Consequently, it is possible to prevent the occurrence of the residual mass of the liquid 31 at the place near the boundary location of the applying roller 33 and the restriction roller 34.

And further, according to this liquid supplying unit, the transfer paper 10 is pressed only at the portions brought into contact with the disks 34a, while the paper 10 is not pressed at the portions brought into contact with the flow path. For this reason, the expansion of the paper hardly occurs at the portions of the transfer paper 10 brought into contact with the disks 34a, while the other portions of the transfer paper 10 brought into contact with the flow path the transfer paper 10 are apt to expand due to the paper fiber's expansion.

Consequently, in accordance with the difference of the extent of the paper expansion, the waving phenomenon occurs on the transfer paper 10, and therefore it seems that there occurs a portion of the transfer paper 10 not brought into contact with the applying roller 33. On such occasions, the portion of the transfer paper 10 not brought into contact with the applying roller 33 is not supplied with sufficient liquid 31, and thereby the state of applying the liquid 31 on the transfer paper 33 becomes nonuniform.

Figure 15D:
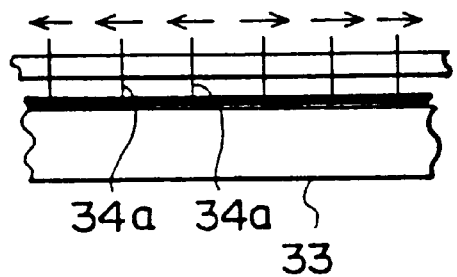
Figure 16A:
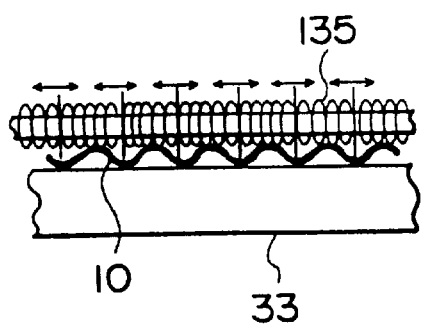
Figure 16B:
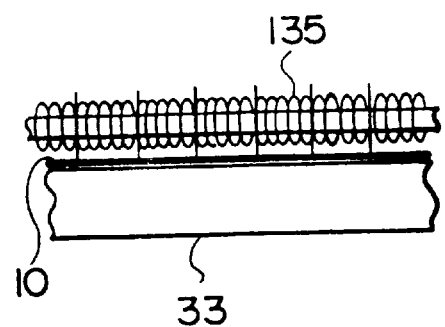

However, the bad contact between the transfer paper 10 and the applying roller 33 due to the waving of the transfer paper 10 does not occur in this liquid supplying unit. Namely, since the respective disks 34a are arranged movably in the direction shown by the arrow in FIG. 15b as mentioned before, on the occasion that the expansion of the transfer paper 10 occurs, the respective disks 34a move in accordance with the expansion thereof and thereby there occurs no expansion of the transfer paper 10. Consequently, it is possible to prevent the nonuniform applying of the liquid 31 onto the transfer paper 10 due to bad contact between the transfer paper 10 and the applying roller 33 caused by the waving of the transfer paper 10, and thereby the liquid 31 turns out to be applied to the transfer paper 10 preferably and uniformly. FIG. 15d is an explanatory diagram showing the state of the disks' (34a) movement in accordance with the expansion of the transfer paper 10.

And further, in this liquid supplying unit, it is preferable to mutually connect the respective disks 34a to each other by use of the resilient or elastic member 135 employed as a supporting means made of, for instance, a spring or rubber, etc. If such an elastic member 135 is provided, even though the disk 34a moves once in accordance with the expansion of the transfer paper 10, when the disk 34a is transported to the position where the transfer paper 10 comes into contact with the disks 34a and thereby the external force is put in a state of not being applied to the disk 34a, the disk 34a returns to its initial position. Consequently, even though the liquid is applied to the transfer paper 10 repeatedly, the position of the disk 34a does not deviate at all. Regarding the strength of supporting the disk 34a of the elastic member 135 on the initial position, it is necessary to set the above strength to an extent of moving the disk 34a by the action of the expansion of the transfer paper 10 against the force of keeping the disk 34a.

Fifth Embodiment

A fifth embodiment of the present invention applicable to a toner removing apparatus for removing toner from a transfer paper employed as an object to be liquid-applied or image carrier having an image formed thereon by use of a transfer-type electrophotographic copying machine is explained hereinafter. In this embodiment, even though a part of the construction of the liquid supplying unit 30 employed as the liquid applying apparatus is different from the toner removing apparatus of the fourth embodiment, the construction of the other parts is the same as that of the fourth embodiment. Therefore, only the liquid supplying unit 30 is explained hereinafter, and the explanation of the other parts is omitted here.

Figure 17:
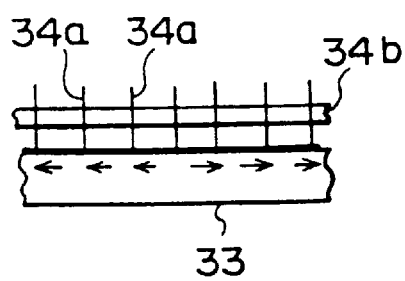
FIG. 17 is an explanatory diagram showing the main part of the liquid supplying unit provided in the toner removing apparatus of a fifth embodiment of the present invention.

FIG. 17 is an explanatory diagram showing the main part of the liquid supplying unit 30 according to the fifth embodiment. In the liquid supplying unit 30, although the construction of the restriction roller 34 differs from that of the liquid supplying unit in the fourth embodiment, the construction of the other parts is same as that in the liquid supplying unit of the fourth embodiment. Namely, in the fourth embodiment, the disk 34a is mounted on the shaft 34b movably thereon, while the disk 34a is fixedly mounted on the shaft 34b in the fifth embodiment. And further, in the fifth embodiment, the disk 34a is constructed with the elastic or resilient member such as resin, metal, or the like.

When a part of the transfer paper 10 brought into contact with the flow path expands due to the expansion of paper fiber, the disk 34a resiliently (elastically) deforms in the direction of the arrows shown in FIG. 17 in accordance with the above-mentioned expansion of the transfer paper 10. Consequently, even though the transfer paper 10 expands, there occurs neither waving of the transfer paper 10 nor bad contact between the transfer paper and the applying roller 33. Furthermore, when the transfer paper 10 is transported to the position not brought into contact with the disk 34a and the same is put in a state of not being applied with the external force, the state of the disk returns to the initial state of not being elastically (resiliently) deformed. Consequently, in the fifth embodiment, even though the elastic (resilient) member 35 as shown in the fourth embodiment is not provided, it is possible to prevent the deviation of the arrangement (position) of the disks 34a.

Sixth Embodiment

A sixth embodiment of the present invention applicable to a toner removing apparatus for removing toner from a transfer paper employed as an object to be liquid-applied or image carrier having an image formed thereon by use of a transfer-type electrophotographic copying machine is explained hereinafter. In this embodiment, even though a part of the construction of the liquid supplying unit 30 employed as the liquid applying apparatus is different from the toner removing apparatus of the fourth embodiment, the construction of the other parts is the same as that of the fourth embodiment. Therefore, only the liquid supplying unit 30 is explained hereinafter, and the explanation of the other parts is omitted here.

Figure 18A:
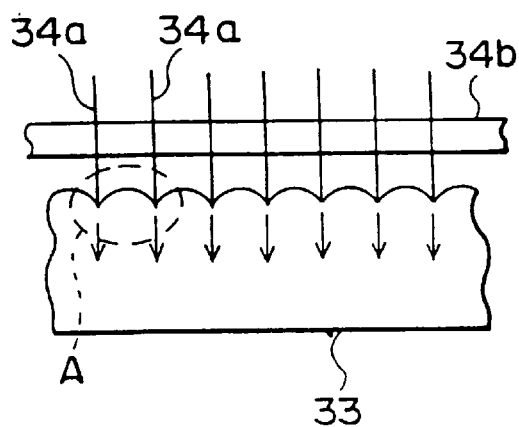
FIG. 18a is an explanatory diagram showing the main part of the liquid supplying unit provided in the toner removing apparatus of a sixth embodiment of the present invention.
Figure 18B:
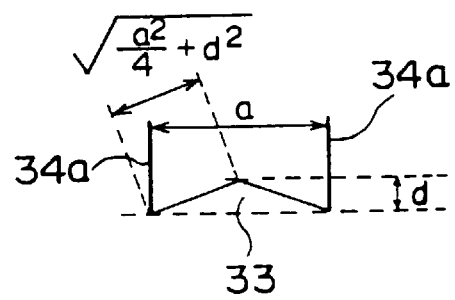

FIG. 18a is an explanatory diagram showing the main part of the liquid supplying unit 30 according to the sixth embodiment, and FIG. 18b is an enlarged explanatory view for explaining the A-portion encircled by the dotted line in FIG. 18a. As shown in FIG. 18, although the construction of the restriction roller 34 and the applying roller 33 is different from that in the fourth embodiment, the construction of the other parts is the same as that in the fourth embodiment. Namely, in the fourth embodiment, the disk 34a is mounted on the shaft 34b movably therealong, while the disk 34a is fixedly mounted on the shaft 34b. And further, in this embodiment, the applying roller 33 is made of a material such as chloroprene which is deformable by pressing the disk 34a to the applying roller 33. Furthermore, the restriction roller is provided with pushing means not shown in FIG. 18 including a spring, rubber, etc. for pressing the disk 34a to the applying roller 33 through the shaft 34b.

Assuming that the distance between the disks 34a is "a", the deformation amount d of the applying roller 33 is the direction perpendicular thereto caused by pressing the disk 34a is "d", the length of the recording (transfer) paper 10 in the direction perpendicular to the transporting direction of the recording (transfer) paper 10 is "L", and the expansion length of the recording (transfer) paper in the same direction is "ΔL", as shown in FIG. 18b, the liquid supplying unit 30 of this embodiment is explained hereinafter. In this liquid supplying unit, the above-mentioned deformation amount "d" is determined such that the length of the applying roller 33 between the adjacent disks 34a after the occurrence of the deformation thereof becomes larger than the length therebetween of the applying roller 33 after the occurrence of the expansion of the transfer paper 10. Namely, since the expansion of the transfer paper 10 between the respective disks 34a is a·ΔL/L, the relationship between the above factors is expressed by the following inequality (1):

$$2\sqrt{\frac{a^2}{4} + d^2} > a + \frac{\Delta L \cdot a}{L} \tag{1}$$

Namely, the deformation amount "d" is determined by the following inequality (2):

$$d > \frac{a}{2}\sqrt{\frac{\Delta L}{L}\left(2 + \frac{\Delta l}{L}\right)} \tag{2}$$

If the deformation amount "d" is determined in such a manner, even though the transfer paper 10 expands, the entire surface of the transfer paper 10 is put in a state of coming in contact with the applying roller 33, and thereby the liquid 31 is applied to the transfer paper 10 uniformly and preferably.

Seventh Embodiment

A seventh embodiment of the present invention applicable to a toner removing apparatus for removing toner from a transfer paper employed as an object to be liquid-applied or image carrier having an image formed thereon by use of a transfer-type electrophotographic copying machine is explained hereinafter. In this embodiment, even though a part of the construction of the liquid supplying unit 30 employed as the liquid applying apparatus is different from the toner removing apparatus of the fourth embodiment, the construction of the other parts is the same as that of the fourth embodiment. Therefore, only the liquid supplying unit 30 is explained hereinafter, and the other explanation is omitted here.

Although the construction of the liquid supplying unit 30 and the restriction roller 34 is different from that of the fourth embodiment, the construction of the other parts is the same as that of the fourth embodiment. Namely, in the fourth embodiment, the disk 34*a* is mounted movably on the shaft 34*b*, while the disk 34*a* is fixedly mounted on the shaft 34*b* in the seventh embodiment. And further, the distance "d" formed by the disks 34*a* put adjacently to each other is established to a value not larger than 5 mm. In this liquid supplying unit, since the distance d is made sufficiently narrow, the waving of the transfer paper 10 hardly occurs and the unevenness of applying the liquid 31 to the transfer paper 10 does not occur. The value of 5 mm is one determined by evaluating the state of applying the liquid 31 to the transfer paper 10 by changing the distance "d" for the respective transfer papers. As the result of performing such an evaluation, it has been confirmed that the preferable result can be obtained by making the distance not larger than 2 mm.

Figure 19A:
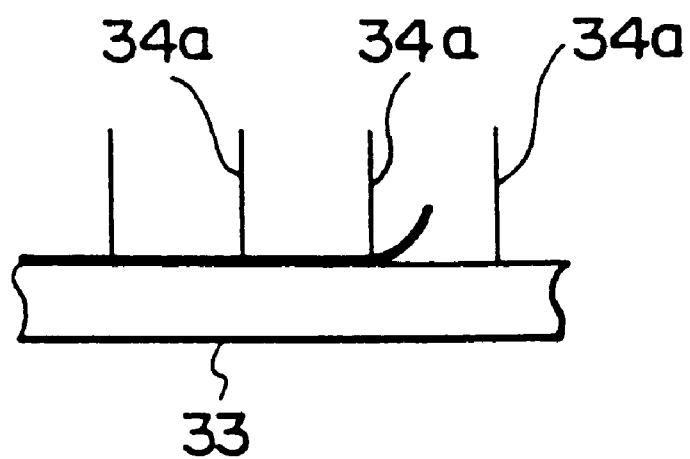
FIG. 19a is an explanatory diagram showing the state of curling at the both tip ends of the transfer paper.

It is not always necessary to set the distance "d" constant (to the same value) in the overall area of the direction perpendicular to the transporting direction of the transfer paper 10. Namely, as the result of the evaluation, it is allowable that the distance "d" is made narrow toward the both end portions of the transfer paper 10 on which the unevenness of applying the liquid 31 is proved to be apt to occur by the experiment. Moreover, the reason why the unevenness of applying the liquid 31 is apt to occur at the both end portions of the transfer paper 10 is that, as shown in FIG. 19*a*, the curling of the transfer paper 10 occurs at the both end portions and the curling portion hardly comes into contact with the applying roller 33.

Figure 19B:
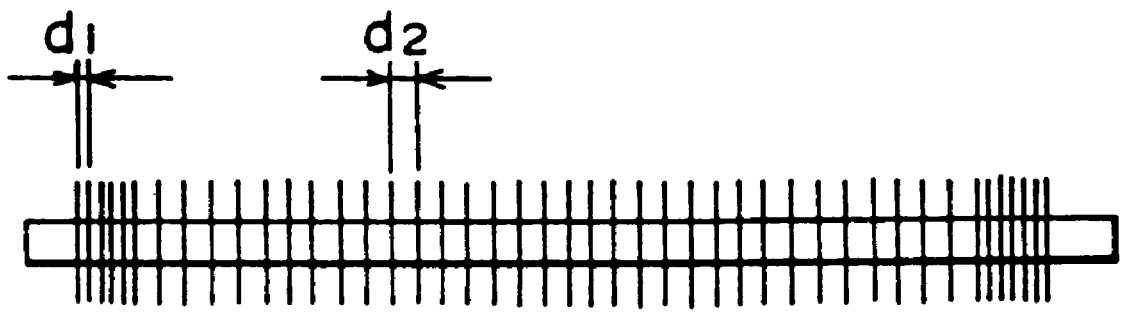
FIG. 19b is an explanatory diagram showing the restriction roller provided in the toner removing apparatus of a seventh embodiment of the present invention.

FIG. 19*b* is an explanatory diagram showing the restriction rollers 34. The distance "d" between the adjacent rollers 34 in the area at the both end portions is made narrow, while the distance "d" therebetween in the area at the center portion is made wide. Regarding these restriction rollers 34, it is desirable that the distance d1 at the both end portions is set to a value not larger than 5 mm and the distance d2 at the center portion is set to a value not larger than 10 mm. Furthermore, it has been confirmed that further preferable result could be obtained by setting the distance d1 to a value not larger than 2 mm and setting the distance d2 to a value not larger than 5 mm.

Eighth Embodiment

An eighth embodiment of the present invention applicable to a toner removing apparatus for removing toner from a transfer paper employed as an object to be liquid-applied or an image carrier having an image formed thereon by use of a transfer-type electrophotographic copying machine is explained hereinafter. In this embodiment, even though a part of the construction of the liquid supplying unit 30 employed as the liquid applying apparatus is different from the toner removing apparatus of the fourth embodiment, the construction of the other parts is the same as that of the fourth embodiment. Therefore, only the liquid supplying unit 30 is explained hereinafter, and the explanation of the other parts is omitted here.

Figure 20:
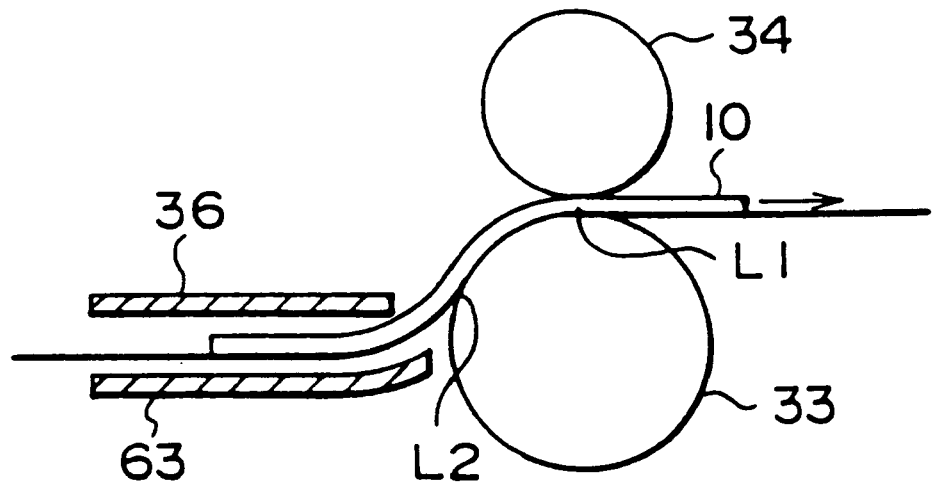
FIG. 20 is an explanatory diagram showing the main part of the liquid supplying unit provided in the toner removing apparatus of an eighth embodiment of the present invention.

FIG. 20 is an explanatory diagram showing the main part of the liquid supplying unit 30 according to the eighth embodiment. In the liquid supplying unit 30 of the fourth embodiment, the applying roller 33 is brought into line contact with the transfer paper 10, and the liquid 31 is applied from the applying roller 33 to the transfer paper 10 at the line contact portion.

However, as shown in FIG. 20, in the liquid supplying unit 30 of the eighth embodiment, the applying roller 33 is brought into surface contact with the transfer paper 10, and the liquid 31 is applied from the applying roller 33 to the transfer paper 10 at the surface contact portion. Namely, in the liquid supplying unit of the fourth embodiment, the transfer paper 10 is transported toward the tangent line where the restriction roller 34 and the applying roller 33 border on each other. On the other hand, in the liquid supplying unit of the eighth embodiment, the guide plate 36 for guiding the transfer paper 10 is provided at the side nearer the applying roller 33 than the tangent line L1 where the restriction roller 34 and the applying roller 33 border on each other, and thereby the transfer paper can be transported so as to come into contact with the applying roller 33. Consequently, the transfer paper 10 turns out to be brought into contact with the surface formed between the tangent line L2 where the transfer paper 10 starts to come into contact with the applying roller 33 and the abovementioned tangent line L1.

According to this liquid supplying unit 30, since the time period when the transfer paper 10 comes into contact with the applying roller 33 becomes longer in comparison with the case in which the transfer paper 10 comes into line contact with the applying roller 33, the applying liquid 31 can be applied to the transfer paper 10 uniformly and preferably.

Figure 21:
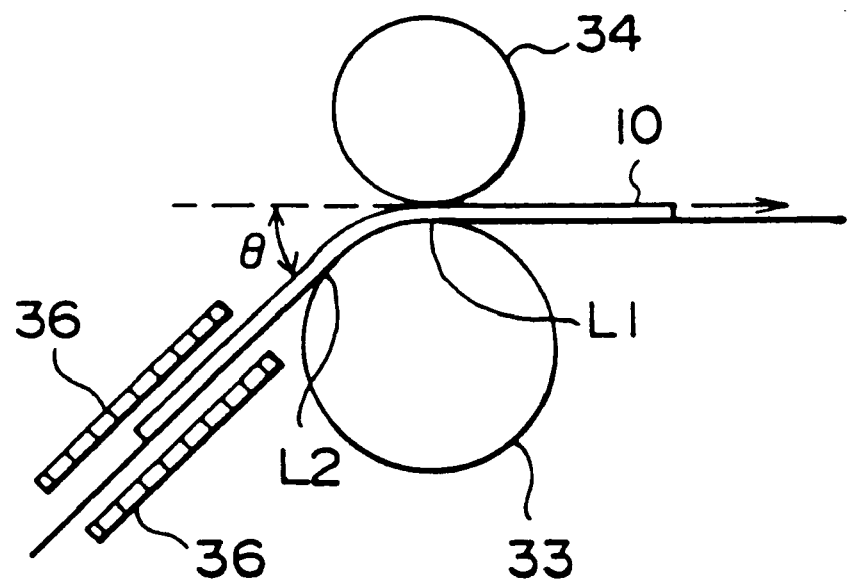
FIG. 21 is an explanatory diagram showing the main part of the liquid supplying unit provided in the toner removing apparatus of a modification of the eighth embodiment.

Moreover, in order to bring the applying roller 33 into surface contact with the transfer paper 10, instead of the above-mentioned construction shown in FIG. 20, it is allowable to adopt a construction in which the surface formed by the transfer paper 10 located at the more upstream side than the tangent line L1 in the paper transporting direction is inclined by the angle θ to the side of the applying roller 33 for the surface formed by the transfer paper 10 located at the more downstream side than the tangent line L1 as shown in FIG. 21.

If such a construction as mentioned above is adopted, the transfer paper 10 turns out also to be brought into contact with the surface formed between the tangent line L2 on which the transfer paper 10 starts to come into contact with the applying roller 33 and the tangent line L1 on which the applying roller 33 comes into contact with the restriction roller 34.

Ninth Embodiment

A ninth embodiment of the present invention applicable to a toner removing apparatus for removing toner from a transfer paper employed as an object to be liquid-applied or an image carrier having an image formed thereon by use of a transfer-type electrophotographic copying machine is explained hereinafter. In this embodiment, even though a part of the construction of the liquid supplying unit 30 employed as the liquid applying apparatus is different from the toner removing apparatus of the fourth embodiment, the construction of the other parts is the same as that of the fourth embodiment. Therefore, only the liquid supplying unit 30 is explained hereinafter, and the other explanation is omitted here.

Figure 22:
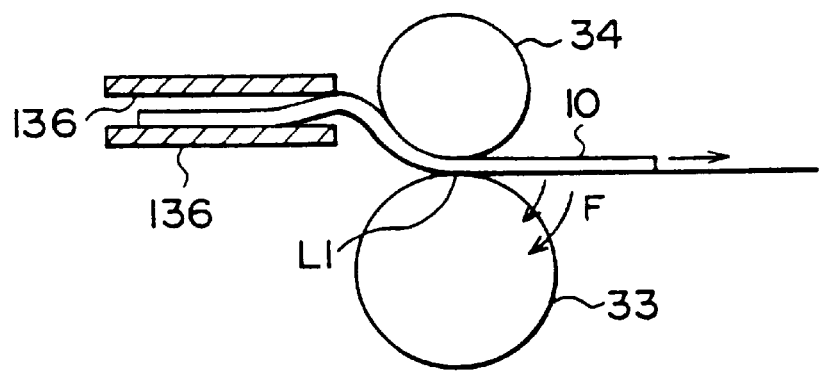
FIG. 22 is an explanatory diagram showing the main part of the liquid supplying unit provided in the toner removing apparatus of a ninth embodiment of the present invention.

FIG. 22 is an explanatory diagram showing the main part of the liquid supplying unit 30 according to the ninth embodiment. In the liquid supplying unit 30 of the fourth embodiment, the transfer paper 10 is pressed to the applying roller 33 by the restriction roller 34. On the other hand, in the liquid supplying unit 30 of the ninth embodiment, the transfer paper 10 is pressed to the applying roller 33 not only by the restriction roller 34 but by the rigidity of the transfer paper itself 10. Namely, in this liquid supplying unit 30, a guide plate 136 for guiding the transfer paper 10 is provided at the side of the restriction roller 34 from the tangent line L1 on which the restriction roller 34 comes into contact with the applying roller 33. In such a construction, the transfer paper 10 is pressed to the applying roller 33 by the action of the rigidity of the transfer paper itself, as shown by the arrow F in FIG. 22.

According to this liquid supplying unit 30, since the transfer paper 10 is pressed to the applying roller 33 by the rigidity of the transfer paper itself 33, the transfer paper 10 can be surely brought into contact with the applying roller 33, and thereby the applying liquid can be applied to the transfer paper 10 uniformly and preferably.

Figure 23:
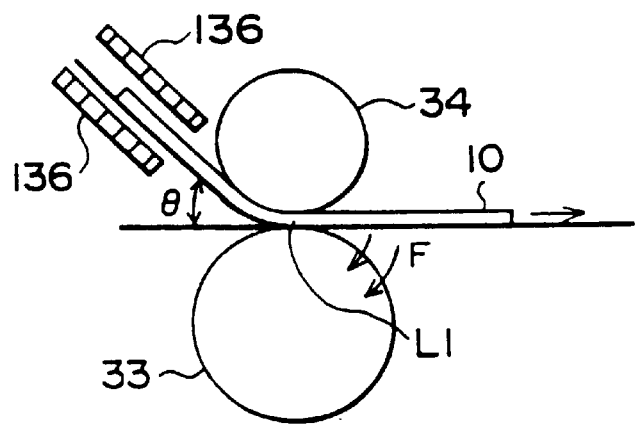
FIG. 23 is an explanatory diagram showing the main part of the liquid supplying unit provided in the toner removing apparatus of a modification of the tenth embodiment.

Moreover, in order to press the transfer paper 10 to the applying roller 33 by the rigidity of the transfer paper itself 10, instead of the above-mentioned construction shown in FIG. 22, it is allowable to adopt the construction in which the surface formed by the transfer paper 10 located at the more upstream side than the tangent line L1, in the paper transporting direction is inclined by the angle $\Theta$ to the side of the restriction roller 34 for the surface formed by the transfer paper 10 located at the more downstream side than the tangent line L1 as shown in FIG. 23.

If such a construction as mentioned above is adopted, the transfer paper 10 can be pressed to the applying roller 33 by the rigidity of the transfer paper itself 10 as shown by the arrow F in FIG. 23.

In the respective embodiments as mentioned heretofore, when the liquid applying to the transfer paper 10 is completed, the liquid 31 is attached to the restriction roller 34 from the applying roller 33 and the attached liquid 31 goes around into the space between the respective disks 34a of the restriction roller 34 on some occasions. In such a case, the liquid 31 is attached also to the surface at the side of the transfer paper 10 coming into contact with the restriction roller 34 not to be applied with the liquid principally, and thereby it needs much time to dry the transfer paper 10 by use of the drying unit 60. The above-mentioned matter is a defect to be solved.

Figure 24:
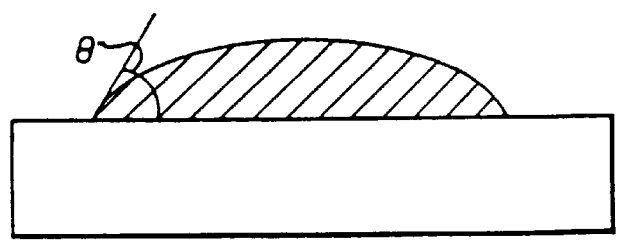
FIG. 24 is an explanatory diagram showing the method of measuring the contact angle for the material water.
Figure 25A:
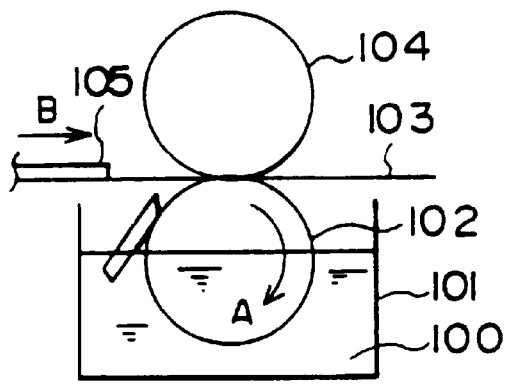
FIG. 25a is an explanatory diagram showing the state of a background image forming substance removing apparatus before applying the unstabilizing liquid to the sheet material.
Figure 25B:
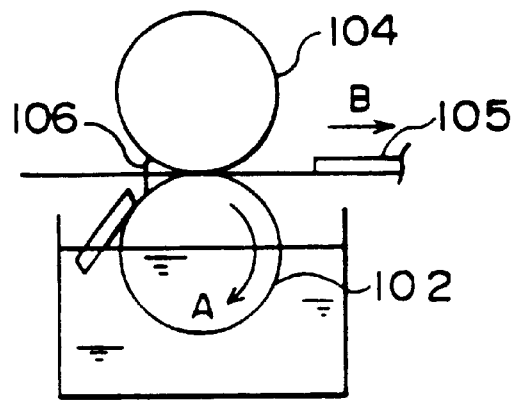
FIG. 25b is an explanatory diagram showing the state of the background image forming substance removing apparatus after applying the unstabilizing liquid to the sheet material.
Figure 25C:
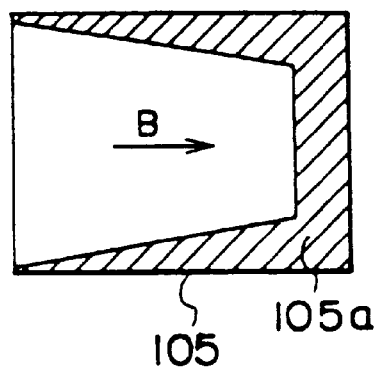
FIG. 25c is an explanatory diagram showing the sheet material applied with the unstabilizing liquid by use of the background image forming substance removing apparatus.

In order to prevent such a defect, in the respective embodiments, it is preferable to form the restriction roller 34 with a material having a contact angle not less than 90° for water. Here, the "contact angle for water" signifies the angle at the contact angle of material surface and water in the case of putting the water on the material surface as shown in FIG. 24. In such a manner, if the restriction roller 34 i, made of the material which is not apt to be wet sufficiently, the processing liquid 31 is prevented from going around into the space between the respective disks 34a, and thereby the afore-mentioned defect does not occur. Moreover, the value not less than 90° of the contact angle for the water is one determined as the result of repeating the evaluation by use of the restriction rollers 34 having various properties of being wet. And further, as the concrete method of forming the restriction roller 34 with the material of the contact angle not less than 90° for the water, the roller 34 is coated with a fluorine system material or a silicone system material.

The present invention is not limited to all of the embodiments mentioned heretofore, but is also applicable to the combinations of the respective embodiments. For instance, by combining the seventh embodiment and the eighth embodiment, the distance between the respective disks 34a is made not larger than 5 mm and the liquid supplying unit is formed so as to bring the applying roller 33 into surface contact with the transfer paper 10.

EXPERIMENTAL EXAMPLES

First Experimental Example

The result of a first experiment for confirming the functional effect of the present invention is shown hereinafter. In this experiment, the liquid supplying unit 30 shown in the first embodiment is employed, and the restriction roller 34 is brought into contact with the applying roller 33 only during the time period of applying the unstabilizing liquid 31 to the transfer paper 10, and the liquid 31 is applied thereto. Here, as the restriction roller 34, one not provided with the liquid supplying material is employed. And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As a result, the unstabilizing liquid 31 is applied to the transfer paper 10 not excessively at the tip end portion and side edge portions thereof, and thereby the liquid 31 is applied uniformly to the entire surface of the transfer paper 10.

Second Experimental Example

The result of a second experiment for confirming the functional effect of the present invention is shown hereinafter. In this experiment, the liquid supplying unit 30 shown in the first embodiment is employed, and the restriction roller 34 is brought into contact with the applying roller 33 during the time period of the restriction roller's one revolution prior to the applying of the unstabilizing liquid 31 to the transfer paper 10, and thereafter the unstabilizing liquid 31 is applied to the transfer paper 10. Here, as the restriction roller 34, one not provided with the liquid supplying material is employed. And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer paper 10.

In comparison with the first experimental example, the curling of the transfer paper 10 becomes smaller.

Third Experimental Example

The result of a third experiment for confirming the functional effect of the present invention is shown hereinafter. In this experiment, the liquid supplying unit 30 shown in the first embodiment is employed, and the restriction roller 34 is brought into contact with the applying roller 33 during the time period of the restriction roller's three revolutions prior to the applying of the unstabilizing liquid 31 to the transfer paper 10, and thereafter the unstabilizing liquid 31 is applied to the transfer paper 10. Here, one provided with a sponge having a hardness of 30 degree, a pore diameter of 100 $\mu$m, and a thickness of 5 mm is employed as the restriction roller 34. And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer paper 10.

The curling of the transfer paper 10 hardly occurs.

Fourth Experimental Example

The result of a fourth experiment for confirming the functional effect of the present invention is shown hereinafter. In this experiment, the liquid supplying unit 30 shown in the second embodiment is employed, and the unstabilizing liquid 31 is applied to the transfer paper 10. A slit having an ejecting nozzle of 3 mm width is used as the air flow nozzle 81, and air including neither vapor nor fine liquid particle is used as the air flow.

And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer paper 10.

Fifth Experimental Example

The result of a fifth experiment for confirming the functional effect of the present invention is shown hereinafter. In this experiment, the liquid supplying unit 30 shown in the second embodiment is employed, and the instabilizing liquid 31 is applied to the transfer paper 10. A slit having an ejecting nozzle of 3 mm width is used as the air flow nozzle 31, and air including the vapor of the unstabilizing liquid is used as the air flow.

And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer paper 10.

In comparison with the fourth experimental example, the curling of the transfer paper 10 becomes smaller.

Sixth Experimental Example

The result of a sixth experiment for confirming the functional effect of the present invention is shown hereinafter. In this experiment, the liquid supplying unit 30 shown in the third embodiment is employed, and the unstabilizing liquid 31 is applied to the transfer paper 10. Two spur rollers 93 are employed as the contact member, and one attached thereto with a sponge having a hardness of 30 degree, a pore diameter of 100 $\mu$m, and a thickness of 5 mm is employed, as the liquid supplying material, at the portions where the respective spur rollers 93 are brought into contact with the transfer paper 10.

And further, as the transfer paper 10, Type 6200 (copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer Paper 10.

And further, there occurs neither curling nor waving on the transfer paper 10.

Seventh Experimental Example

The result of a seventh experiment for confirming the functional effect of the present invention is shown hereinafter. In this experiment, the liquid supplying unit 30 shown in the third embodiment is employed, and the unstabilizing liquid 31 is applied to the transfer paper 10. Two comb-like members 94 are employed as the contact member, and one attached thereto with a sponge having a hardness of 30 degree, a pore diameter of 100 $\mu$m, and a thickness of 5 mm is employed, as the liquid supplying material, at the portions where the respective comb-like members 94 are brought into contact with the transfer paper 10.

And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer paper 10.

And further, there occurs neither curling nor waving an the transfer paper 10.

Eighth Experimental Example

The result of an eighth experiment for confirming the functional effect of the present invention is shown hereinafter. In this experiment, the toner removing apparatus provided with the liquid supplying unit 30 shown in the fourth embodiment is employed, and the liquid 31 is applied to the transfer paper 10 and the toner is removed from the transfer paper 10.

And further, as the transfer paper 10, Type 6200 (copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the unstabilizing liquid 31 is applied to the transfer paper 10 not excessively at the tip end portion and side edge portions thereof, and thereby the liquid 31 is applied uniformly to the entire surface of the transfer paper 10.

And further, the toner can be peeled off preferably.

Ninth Experimental Example

The result of a ninth experiment for confirming the functional effect of the present invention is shown hereinafter. In this experiment, the liquid supplying unit 30 shown in the eighth experiment in which the respective disks 34a are connected with each other by use of a spring is employed. And further, as the transfer paper 10 and the liquid 31, the same ones as those of the first experimental example are employed. As the result, the liquid 31 is uniformly applied to the transfer paper 10, and thereby the toner can be peeled off preferably. Furthermore, even though the liquid 31 is applied to the transfer paper 10 of one hundred sheets, the position of the respective disks 34a does not deviate at all.

Tenth Experimental Example

The result of a tenth experiment for confirming the functional effect of the present invention is shown hereinafter.

In this experiment, the toner removing apparatus provided with the liquid supplying unit 30 shown in the fifth embodiment is employed, and the liquid 31 is applied to the transfer paper 10 and the toner is removed from the transfer paper 10.

And further, as the transfer paper 10, My Paper (Copying Paper made by NBS Co., Ltd.) made the image thereon copied by FT2200 (Copying machine made by Ricoh Co., Ltd.) is employed. And further, as the unstabilizing liquid 31, 1 percent water solution of S113 (Surface Active Agent—Surfactant made by Asahi Garasu Co., Ltd.) is employed. And further, the employed disk 34a is formed with PET (Polyethylene Terephthalate) of a thickness 200 µm.

As the result, the liquid 31 is not excessively applied to the tip end portion and the side edge portions of the transfer paper 10, and thereby the liquid 31 can be applied to the paper 10, and further the toner can be peeled off preferably. Furthermore, even though the liquid 31 is applied to the transfer paper of 100 sheets, the position of the respective disks 34a does not deviate at all.

Eleventh Experimental Example

The result of an eleventh experiment for confirming the functional effect of the present invention is shown hereinafter. In this experiment, the toner removing apparatus provided with the liquid supplying unit 30 shown in the sixth embodiment is employed, and the liquid 31 is applied to the transfer paper 10 and the toner is removed from the transfer paper 10.

And further, as the transfer paper 10, SHIGEN (Copying Paper made by Ricoh Co., Ltd.) made the image thereon copied by FT6500 (Copying machine made by Ricoh Co., Ltd.) is employed. And further, as the unstabilizing liquid 31, 1 percent water solution of MA80 (surface Active Agent—Surfactant made by Mitsui Cytec Co., Ltd.) is employed. And further, chloroprene rubber of a hardness of 30 degree is employed as the material of the applying roller 33. As the result, the liquid 31 is applied not excessively to the tip end portion and the side edge portions of the transfer paper 10, and thereby the liquid can be applied thereto uniformly.

Twelfth-Experimental Example

The result of a twelfth experiment for confirming the functional effect of the present invention is shown hereinafter. In this experiment, the toner removing apparatus provided with the liquid supplying unit 30 shown in the seventh embodiment is employed, and the liquid 31 is applied to the transfer paper 10 and the toner is removed from the transfer paper 10.

And further, as the transfer paper 10, Type 6200 (Copying Paper made by Ricoh Co., Ltd.) made the image thereon copied by IMAGIO 32OFPI (copying machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. Furthermore, the distance between the respective disks 34a is made equal to 2 mm over the entire area of the restriction roller 34. As the result, the unstabilizing liquid 31 is applied to the transfer paper 10 not excessively at the tip end portion and side edge portions thereof, and thereby the liquid 31 is applied uniformly to the entire surface of the transfer paper 10.

Thirteenth Experimental Example

The result of a thirteenth experiment for confirming the functional effect of the present invention is shown hereinafter. In this experiment, in the liquid supplying unit 30 shown in the twelfth experiment, the experiment is performed on the condition that, on the restriction roller 34, in the respective disks 34a, the distance d1 between the respective adjacent disks 34a at the both end portions thereof is 2 mm and the distance d2 therebetween at the center portion of the roller 34 is 5 mm. Furthermore, as the transfer paper 10 and the liquid 31, the same ones as those of the fifth experiment are employed. As the result, the liquid 31 is uniformly applied to the transfer paper 10, and the toner thereon can be peeled off preferably.

Fourteenth Experimental Example

The result of a fourteenth experiment for confirming the functional effect of the present invention is shown hereinafter. In this experiment, the toner removing apparatus provided with the liquid supplying unit 30 shown in the eighth embodiment is employed, and the liquid 31 is applied to the transfer paper 10 and the toner is removed from the transfer paper 10.

And further, as the transfer paper 10, Type 6200 (Copying Paper made by Ricoh Co., Ltd.) made the image thereon copied by IMAGIO 32OFPI (Copying machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. And further, the applying roller 33 having an outer diameter of 16 mm is employed, and the transfer paper 10 is transported by 5 mm from the position where the applying roller 33 comes into contact with the restriction roller 34. As the result, the liquid 31 is uniformly applied to the transfer paper 10, and thereby the toner is peeled off preferably.

Fifteenth Experimental Example

The result of a fifteenth experiment for confirming the functional effect of the present invention is shown hereinafter. In this experiment, the liquid supplying unit 30 (the unit 30 shown in FIG. 10) shown as the modification of the ninth embodiment is employed, and the liquid 31 is applied to the transfer paper 10 and the toner is removed from the transfer paper 10.

And further, as the transfer paper 10, Type 6200 (Copying Paper made by Ricoh Co., Ltd.) made the image thereon copied by IMAGIO 32OFPT (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. And further, the angle θ shown in FIG. 10 is made equal to 30 degree. As the result, the liquid 31 is uniformly applied to the transfer paper 10 and thereby the toner can be peeled off therefrom preferably.

Sixteenth Experimental Example

The result of a sixteenth experiment for confirming the functional effect of the present invention is shown hereinafter. In this experiment, the liquid supplying unit 30 provided with the restriction roller 34 which is made of a material having a contact angle of 110 degree to the water and which is chloroprene rubber of a hardness of 30 degree applied thereto with TG-702 [fluorine system water-shedding (water-proof) agent] is employed, and the liquid 31 is applied to the transfer paper 10, and further the toner is removed from the transfer paper 10 by use of the toner removing apparatus provided with the above-mentioned liquid supplying unit.

And further, as the transfer paper 10, Type 6200 (Copying Paper made by Ricoh Co., Ltd.) made the image thereon copied by IMAGIO 32OFPI (Copying Machine made by Ricoh Co., Ltd.) is employed. And further, as the unstabilizing liquid 31, 1 percent water solution of MA80 (Surface Active Agent—Surfactant made by Mitsui Cytec Co., Ltd.) is employed. As the result, the liquid 31 is uniformly applied to the transfer paper 10 and the toner can be peeled off preferably from the transfer paper. And further, even though the liquid 31 is applied to the transfer paper 10 of 200 sheets, the liquid 31 does not go around into the space between the respective adjacent disks 34a, and thereby the liquid 31 is not attached to the surface of the transfer paper 10 at the side of coming into contact with the restriction roller 34.

Advantageous Functional Effects of the Present Invention

According to the first through third statuses of the present invention, since the excessive liquid residual mass due to the applying liquid does not occur on the position where the liquid applying member and the contact member are put adjacently to each other, the occurrence of a bad transportation state of the object to be liquid-applied due to the excessive attachment of the applying liquid to the tip end portion, etc. of the object to be liquid-applied can be prevented, and thereby preferable liquid attachment can be realized. Furthermore, the object to be liquid-applied can be dried for a short time period, after applying the liquid thereto.

In particular, according to the second or third status of the present invention, the applying liquid is applied to not only the surface of the object to be liquid-applied at the side of coming into contact with the liquid applying member, but also the surface thereof at the other side of coming into contact with the contact member. Consequently, in the case of applying the applying liquid only to the one-side surface of the object to be liquid-applied, the occurrence of curling on the object to he liquid-applied due to the expansion of only the fiber of the object to be liquid-applied at the side of being applied with the applying liquid can be prevented.

In particular, according to the third status of the present invention, the applying liquid is uniformly and surely applied to the surface of the object to be liquid-applied at the side of coming into contact with the contact member. Consequently, in the case of applying the applying liquid only to the one-side surface of the object to be liquid-applied, the occurrence of curling on the object to be liquid-applied due to the expansion of only the fiber of the sheet at the side of being applied with the applying liquid can be prevented further surely.

According to the fourth or fifth status of the present invention, since the liquid residual mass due to the applying liquid does not occur at the position where the liquid applying member and the contact member are put adjacently to each other, the occurrence of bad transportation of the object to be liquid-applied due to the attachment of the excessive applying liquid to the tip end portion, etc. of the object to be liquid-applied can be prevented, and thereby preferable liquid applying can be realized. Furthermore, it is possible to dry the object to be liquid-applied in a short time period after applying the liquid thereto.

In particular, according to the fifth status of the present invention, the applying liquid is applied to not only the surface of the object to be liquid-applied at the side of coming into contact with the liquid applying member, but also the other surface thereof at the side of receiving the air flow. Consequently, in the case of applying the liquid only to the one-side surface of the object to be liquid-applied, it is possible to prevent the occurrence of curling of the object to be liquid-applied due to the expansion of only the fiber of the object to be liquid-applied at the side of being liquid-applied.

According to the sixth through tenth status of the present invention, since there occurs no liquid residual mass of the applying liquid at the position where the liquid applying member and the contact member are put adjacently to each other, the occurrence of the bad transportation of the object to be liquid-applied due to attaching of the excessive applying liquid to the tip end portion, etc. of the object to be liquid-applied is prevented, and thereby preferable applying of the liquid can be realized. And further, the object to be liquid-applied can be dried in a short period after applying the liquid.

According to the seventh status of the present invention, since the object to be liquid-applied which is applied with the liquid is put in a state of being flat, there occurs no waving on the object to be liquid-applied.

According to the eighth status of the present invention, since the applying liquid is uniformly applied to the surface of the object to be liquid-applied, there occurs no waving of the object caused in the case of nonuniformly applying the liquid thereto.

According to the ninth or tenth status of the present invention, it is possible to suppress the cost-up of manufacturing the contact member, and thereby the cost-up of manufacturing the liquid applying apparatus can be suppressed also. Consequently, the above apparatus can be kept at low cost.

According to the eleventh status of the present invention, even though the object to be liquid-applied expands, the respective pressurized contact portions move and thereby it is possible to always keep the object to be liquid-applied and the liquid applying member in a state of preferably coming into contact with each other. Consequently, there occurs no nonuniform liquid applying to the liquid applying member as in case that the object to be liquid-applied comes into bad contact with the liquid applying member, and thereby the liquid can be preferably applied to the object to be liquid-applied.

In particular, according to the twelfth status of the present invention, even though the pressurized contact portion moves in accordance with the expansion of the object to be liquid-applied, when the object to be liquid-applied passes therethrough and the external force is not applied to the pressurized contact portion, the pressurizing contact member moves onto the predetermined position and the same is kept on the position. Consequently, even though the liquid applying process is performed repeatedly, there occurs no deviation due to the positional shift of the pressurized contact portion.

According to the thirteenth status of the present invention, even though the object to be liquid-applied expands, the above object and the liquid applying member are always kept in a state of being brought into preferable contact with each other owing to the elastic deformation of the elastic body. Consequently, there occurs no nonuniform liquid applying to the liquid applying member as in case that the object to be liquid-applied comes into bad contact with the liquid applying member, and thereby the liquid can be preferably applied to the object to be liquid-applied.

According to the fourteenth status of the present invention, since the length of the liquid-applying member between the adjacent pressurizing contact members is larger than the length of the object to be liquid-applied therebetween, there occurs no state of floating up of the object to be liquid-applied, and thereby the object and the liquid applying member are always put in preferable contact with each other. Consequently, there occurs no nonuniform liquid applying to the liquid applying member as in case that the object to be liquid-applied comes into bad contact with the liquid applying member, and thereby the liquid can be preferably applied to the object to be liquid-applied.

According to the fifteenth status of the present invention, the distance between the pressurizing contact portions put adjacently to each other is set sufficiently small, for instance, not larger than 5 mm, and the object to be liquid-applied is prevented from floating up from the liquid applying member. Consequently, the applying liquid can be applied to the above object uniformly and preferably.

According to the sixteenth status of the present invention, since the object to be liquid-applied is pressed to the liquid applying member by more pressurizing contact portions in the areas toward the both end (edge) portions which are apt to be in a state of being curled and floating up from the liquid applying member, the above object can be prevented from floating up from the liquid applying member, and thereby the applying liquid can be applied to the object to be liquid-applied uniformly and preferably. Furthermore, since the number of the pressurizing contact portions is decreased in the area departing from the both end portions toward the center portion, it is possible to employ the contact member simply constructed with a small number of the pressurizing contact portions as an overall structure of the contact member.

According to the seventeenth status of the present invention, since the object to be liquid-applied is brought into surface contact with the liquid applying member and thereby the above object keeps the state of contact with the liquid applying member for a longer time period in comparison with the case of the line contact. Consequently, the applying liquid can be applied to the object to be liquid-applied preferably and uniformly.

According to the eighteenth status of the present invention, since the object to be liquid-applied is pressed to the liquid applying member by the action of its own rigidity, the liquid can be applied to the object to be liquid-applied preferably and uniformly.

According to the nineteenth status of the present invention, since the sufficiently not-wettable material is employed as the contact member, it can be prevented that the applying liquid goes around into the flow path portion of the contact member, and next the applying liquid is applied even to the rear side of the object to be liquid-applied which is not to be liquid-applied in principle at the time of applying the liquid to the above object.

According to the twentieth status of the present invention, since the unstabilizing liquid is applied to the image carrier preferably and uniformly, there occurs no unevenness of removing the image forming substance occurring in a case that the applying of the liquid is nonuniform, and thereby the image forming substance can be removed preferably. Furthermore, the amount of consuming the applying liquid can be suppressed to a small value.

What is claimed is:

1. A liquid applying apparatus comprising:

a liquid applying member for carrying liquid and applying said liquid on a sheet-state object to be liquid-applied;

air-flow generating means opposing a surface of said liquid applying member, such that the sheet-state object passes between said liquid applying member and said air-flow generating means, and disposed at a position detached from said liquid applying member, for generating an air-flow for bringing said object to be liquid-applied into contact with said surface of said liquid applying member by use of the air-flow; and control means connected to said air-flow generating means for controlling said air-flow generating means to generate the air-flow only when the liquid applying member and the sheet-state object are at a position of coming in contact with each other and to not generate the air-flow when said liquid applying member does not come in contact with the sheet-state object.

2. The liquid applying apparatus as defined in claim 1, further comprises means in communication with the air-flow generating means for introducing a liquid vapor into said air-flow, wherein said liquid is one of said applying liquid or aqueous vapor or fine liquid particles of said applying liquid or water, and said control means controls an amount of the vapor in said air-flow.

3. A liquid applying apparatus as defined in claim 1, wherein said liquid applying member is a roller.

4. A liquid applying apparatus as defined in claim 1, wherein said air-flow generating means comprises a heater unit.

5. A liquid applying apparatus as defined in claim 1, wherein said air-flow generating means comprises an ultrasonic vibrating unit.

* * * * *